US012696639B2

(12) United States Patent　　(10) Patent No.:　US 12,696,639 B2
Watakabe et al.　　　　　　　　(45) Date of Patent:　　　Jul. 28, 2026

(54) DISPLAY DEVICE

(71) Applicants:Japan Display Inc., Tokyo (JP); IDEMITSU KOSAN CO., LTD., Tokyo (JP)

(72) Inventors: Hajime Watakabe, Tokyo (JP); Masashi Tsubuku, Tokyo (JP); Toshinari Sasaki, Tokyo (JP); Takaya Tamaru, Tokyo (JP)

(73) Assignees: JAPAN DISPLAY INC., Tokyo (JP); IDEMITSU KOSAN CO., LTD., Tokyo (JP)

( * ) Notice: Subject to any disclaimer, the term of this patent is extended or adjusted under 35 U.S.C. 154(b) by 392 days.

(21) Appl. No.: 18/230,171

(22) Filed: Aug. 4, 2023

(65) Prior Publication Data

US 2024/0057413 A1　　Feb. 15, 2024

(30) Foreign Application Priority Data

Aug. 10, 2022　(JP) ................................. 2022-128007

(51) Int. Cl.
　*H10K 59/131*　　(2023.01)
　*H10K 59/121*　　(2023.01)
(52) U.S. Cl.
　CPC ....... *H10K 59/131* (2023.02); *H10K 59/1213* (2023.02)
(58) Field of Classification Search
　CPC .. H10K 59/1213; H10K 59/131; H10K 59/65; H10D 86/60; H10D 86/441; H10D 86/423
　See application file for complete search history.

(56) References Cited

U.S. PATENT DOCUMENTS

2015/0091000 A1*　4/2015　Morita ............... H10D 30/6756
　　　　　　　　　　　　　　　　　　　　　　　257/43
2015/0097182 A1　　4/2015　Park et al.
　　　　　　　　　　　　(Continued)

FOREIGN PATENT DOCUMENTS

JP　　　2021-089428 A　　6/2021
KR　　　20150040569 A　　4/2015
　　　　　　　　(Continued)

OTHER PUBLICATIONS

English machine translation of Office Action dated Jun. 30, 2025, issued in Korean Patent Application No. 10-2023-0096711, 7pp.

*Primary Examiner* — Vongsavanh Sengdara
(74) *Attorney, Agent, or Firm* — XSENSUS LLP

(57)　　　　　ABSTRACT

A display device includes a display panel including a display portion having a plurality of pixels; and a sensor element disposed on a rear side of the display portion. The display portion has a first region overlapping the sensor element and a second region other than the first region in a plan view. Each of the plurality of pixels has a semiconductor device including a channel portion and a conductive portion made of an oxide semiconductor having a polycrystalline structure. Each of the plurality of pixels in the first region is connected by a first signal line comprising the same layer as the conductive portion, and each of the plurality of pixels in the second region is connected by a second signal line comprising a metal layer connected to the conductive portion.

6 Claims, 33 Drawing Sheets

(56) References Cited

U.S. PATENT DOCUMENTS

| 2017/0170208 A1* | 6/2017 | Yuan ..................... H10D 86/60 |
| 2021/0028252 A1 | 1/2021 | Hong et al. |
| 2021/0167163 A1 | 6/2021 | Jeong et al. |
| 2021/0202755 A1* | 7/2021 | Ok ..................... H10D 30/6755 |
| 2022/0069045 A1* | 3/2022 | Ebisuno .............. H10K 59/124 |
| 2022/0199784 A1 | 6/2022 | Kawashima et al. |

FOREIGN PATENT DOCUMENTS

| KR | 20210013500 A | 2/2021 |
| KR | 20210144707 A | 11/2021 |

* cited by examiner

DISPLAY DEVICE

CROSS-REFERENCE TO RELATED APPLICATION

This application claims the benefit of priority to Japanese Patent Application No. 2022-128007, filed on Aug. 10, 2022, the entire contents of which are incorporated herein by reference.

FIELD

One embodiment of the invention relates to a display device.

BACKGROUND

In recent years, there has been known a display device in which an imaging element is arranged on a back side of a display panel and a subject facing a display device is imaged. For example, a display device described in Japanese laid-open patent publication No. 2021-89428 displays images on an entire display region in a normal state, and performs an imaging process using a camera arranged on the back side during imaging. When capturing an image, the camera captures an image of the subject by capturing a light transmitted through the display panel.

SUMMARY

A display device in one embodiment of the invention includes a display panel including a display portion having a plurality of pixels; and a sensor element arranged on a rear side of the display portion. The display portion has a first region overlapping the sensor element and a second region other than the first region in a plan view. Each of the plurality of pixels has a semiconductor device including a channel portion and a conductive portion made of an oxide semiconductor having a polycrystalline structure. Each of the plurality of pixels in the first region is connected by a first signal line including the same layer as the conductive portion, and each of the plurality of pixels in the second region is connected by a second signal line including a metal layer connected to the conductive portion.

BRIEF DESCRIPTION OF THE DRAWINGS

FIG. 6 is a cross-sectional view showing a structure of a pixel in an imaging region in a display device according to an embodiment of the present invention.

FIG. 12A is a schematic view for explaining a coupling condition of Poly-OS contained in a conductive portion of an oxide semiconductor layer.

FIG. 12B is a schematic view for explaining a coupling condition of Poly-OS contained in a conductive portion of an oxide semiconductor layer.

FIG. 12C is a schematic view for explaining a coupling condition of Poly-OS contained in a conductive portion of an oxide semiconductor layer.

DESCRIPTION OF EMBODIMENTS

Figure 1:
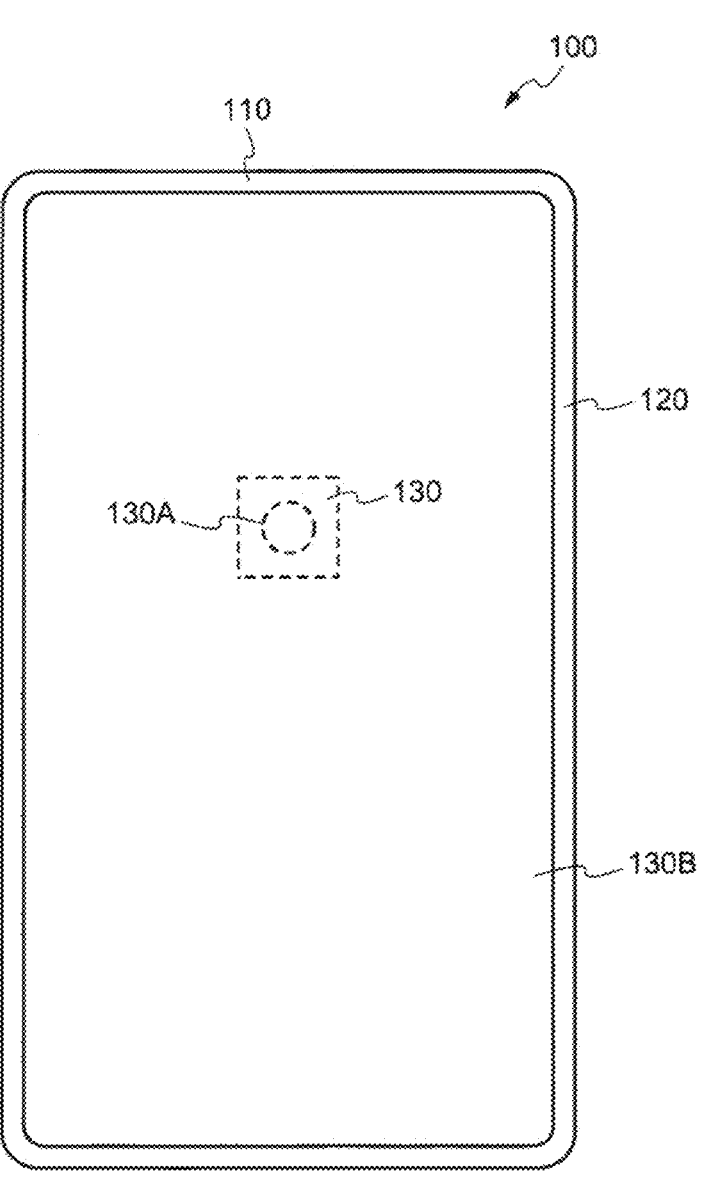
FIG. 1 is a plan view showing an external view of a display device according to an embodiment of the present invention.

As described above, in a conventional display device, external light that enters a camera passes through a display panel, so the transmittance of the display panel greatly affects the quality of a captured image. Therefore, it is desirable to increase the transmittance of the display panel as much as possible in the display device that performs imaging via the display panel. However, the display region of the display panel is arranged with a plurality of pixels for displaying images, and many elements and wirings constituting each pixel are arranged. In the conventional display device described above, the transmittance is increased by devising a layer structure of the display panel, but the flexibility of designing the circuit is reduced.

An object of an embodiment of the present invention is to provide a display device with a simple structure and improved transmittance of a display panel.

Hereinafter, embodiments of the present invention will be described with reference to the drawings. The following disclosure is merely an example. A configuration that can be easily conceived by a person skilled in the art by appropriately changing the configuration of the embodiment while keeping the gist of the invention is naturally included in the scope of the present invention. In order to make the description clearer, the drawings may schematically show the width, thickness, shape, and the like of each part in comparison with an actual embodiment. However, the illustrated shapes are merely examples, and do not limit the interpretation of the present invention. In the present specification and the drawings, the same reference signs are given to elements similar to those described above with respect to the above-described drawings, and detailed description thereof may be omitted as appropriate.

In the embodiments described below, a direction from a substrate toward an oxide semiconductor layer is referred to as "on" or "above". Conversely, a direction from the oxide semiconductor layer to the substrate is referred to as "under" or "below". As described above, for convenience of explanation, the phrase "above" or "below" is used to describe, but for example, the upper and lower relationship between the substrate and the oxide semiconductor layer may be arranged so as to be opposite to those shown in the drawings. In the following explanation, for example, the expression "an oxide semiconductor layer on a substrate" merely describes the upper and lower relationship between the substrate and the oxide semiconductor layer as described above, and another member may be arranged between the substrate and the oxide semiconductor layer. Above or below refers to the stacking order in which a plurality of layers is stacked, and when expressed as "a pixel electrode above a transistor", it may be a positional relationship in which the transistor and the pixel electrode do not overlap in a plan view. On the other hand, the expression "a pixel electrode vertically above a transistor" means a positional relationship in which the transistor and the pixel electrode overlap in a plan view.

In the embodiments described below, the "surface side" refers to a side constituting a display screen in a display device, and the "back surface side" refers to a side opposed to the surface side.

In the embodiments described below, a plurality of elements formed by subjecting a certain film to a processing process such as etching may be described as elements having different functions or roles. These elements are composed of the same layer structure and the same material, and are described as elements composed of the same layer.

In the embodiments described below, "display device" refers to a device that displays an image using an electro-optical layer. For example, the term display device refers to a device with other optical members (for example, sensor elements, polarizing member, backlight, or touch panel, and the like) attached to a display panel that includes the electro-optical layer. "Electro-optical layer" may include a liquid crystal layer, an electroluminescent (EL) layer, an electrochromic (EC) layer, an electrophoretic layer, unless there is no technical contradiction. In the embodiments described below, although an organic EL display device including an organic EL layer is exemplified, the present invention can also be applied to a display device including the other electro-optical layers described above.

In each of the embodiments described below, the expressions "a includes A, B, or C," "a includes any of A, B, and C," "a includes one selected from a group consisting of A, B, and C," and the like do not exclude the case where a includes a plurality of combinations of A to C unless otherwise specified. Furthermore, these expressions do not exclude the case where a includes other elements.

First Embodiment

[Configuration of Display Device]

A display device 100 according to an embodiment of the present invention will be described. In the present embodiment, the display device 100 is a mobile terminal (for example, a smart phone) including an organic EL panel as a display panel. However, without being limited to this example, the display panel may be a display panel including a liquid crystal layer, an inorganic EL layer, an electrochromic layer, or an electrophoretic layer.

FIG. 1 is a plan view showing an external view of the display device 100 according to an embodiment of the present invention. As shown in FIG. 1, the display device 100 of the present embodiment includes a housing 110, a display screen 120, and an imaging unit 130. The housing 110 houses a circuit group for driving an organic EL panel 200 and controlling a mobile terminal, which will be described later. The display screen 120 is an interface for displaying images. The display screen 120 is a surface of the organic EL panel 200 housed in the housing 110. The surface of the organic EL panel 200 functions as the display screen 120 by being visually recognized through a cover glass or the like. The imaging unit 130 includes an imaging element 132, which will be described later, and a control unit (not shown) for imaging incident light detected by the imaging element 132 as an image.

The imaging unit 130 is housed inside the housing 110 and is arranged on a back surface side of the organic EL panel 200. That is, when the viewpoint of a user is used as a reference, the imaging unit 130 is arranged on the back side of the display screen 120 and therefore cannot be visually recognized by the user. In addition, in the present specification, a region of the organic EL panel 200 in a plan view that overlaps a portion where the imaging element 132 of the imaging unit 130 is arranged is referred to as an "imaging region 130A". In the display device 100 of the present embodiment, the imaging region 130A differs from region (that is, a non-imaging region 130B) other than the imaging region 130A in a pixel structure. This point will be described later.

In the present embodiment, during normal image display, image display is performed on the entire display screen 120 including both the imaging region 130A and the non-imaging region 130B. On the other hand, when capturing an image, only the imaging region 130A is stopped. Specifically, when capturing an image, a light emission of a pixel located in the imaging region 130A is stopped, and the imaging region 130A is set to a state in which external light is transmitted. For example, stopping the image display of the imaging region 130A over one or a plurality of frames during the image display allows the external light to reach the imaging element 132 and perform an imaging process.

In the present embodiment, although an example in which the imaging element 132 (for example, a camera) is arranged on the back surface side of the organic EL panel 200 is shown, the device arranged on the back surface side is not limited to the imaging element, and may be a sensor element. For example, the sensor element may be an optical sensor or the like that detects external light.

Figure 2:
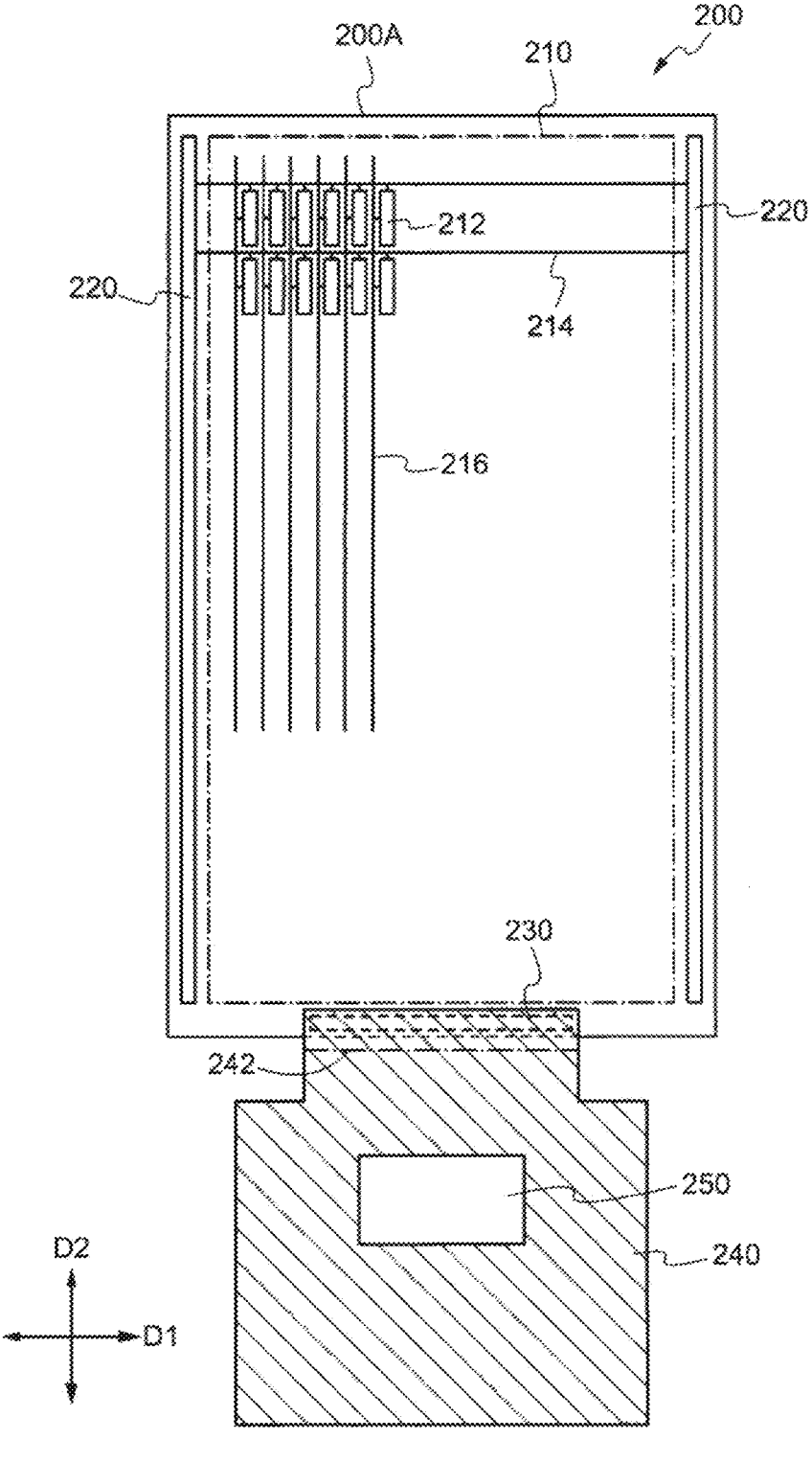
FIG. 2 is a plan view showing a configuration of an organic EL panel in a display device according to an embodiment of the present invention.

FIG. 2 is a plan view showing a configuration of the organic EL panel 200 in the display device 100 according to an embodiment of the present invention. However, for convenience of explanation, a circuit substrate 200A of the organic EL panel 200 is illustrated in FIG. 2, and other elements (for example, an optical member such as a polarization plate) are not illustrated.

As shown in FIG. 2, a display circuit 210, a scan signal line drive circuit 220, and a terminal portion 230 are arranged on the surface side of the circuit substrate 200A of the organic EL panel 200. In addition, although the imaging region 130A shown in FIG. 1 has a pixel structure that is different from that of the non-imaging region 130B, the basic arrangement is as shown in FIG. 2.

The circuit substrate 200A is a substrate in which a plurality of semiconductor devices formed using an oxide semiconductor is arranged on a support substrate having light transmittance. In the present embodiment, although an example in which a thin film transistor is arranged as the semiconductor device is shown, the present invention is not limited to this example, and other semiconductor devices may be arranged as long as they function as switching elements. The circuit substrate 200A may also be referred to as an active-matrix substrate. A substrate having light transmittance can be used as the support substrate constituting the circuit substrate 200A. For example, a glass substrate or a substrate having flexibility is preferably used as the support substrate.

The display circuit 210 is a circuit for controlling a plurality of pixels 212 for displaying images. Specifically, the display circuit 210 includes a plurality of scan signal lines 214 extending in a first direction (direction D1) and a plurality of video signal lines 216 extending in a second direction (direction D2), and the pixel 212 including a semiconductor device such as a thin film transistor corresponding to each of intersections of the plurality of scan signal lines 214 and the plurality of video signal lines 216. In the present embodiment, the individual pixels 212 are sub-pixels corresponding to any of the colors R (red), G (green), and B (blue). Therefore, in practice, color display is performed in units of one pixel (main pixel) including three pixels 212 corresponding to each color of RGB.

In this case, a pixel circuit 300 for controlling light emission of the individual pixels 212 will be described with reference to FIG. 3. For convenience of explanation, although a basic configuration using two semiconductor devices (thin film transistors) will be described as an example, the configuration of the pixel circuit 300 is not limited to this example.

Figure 3:
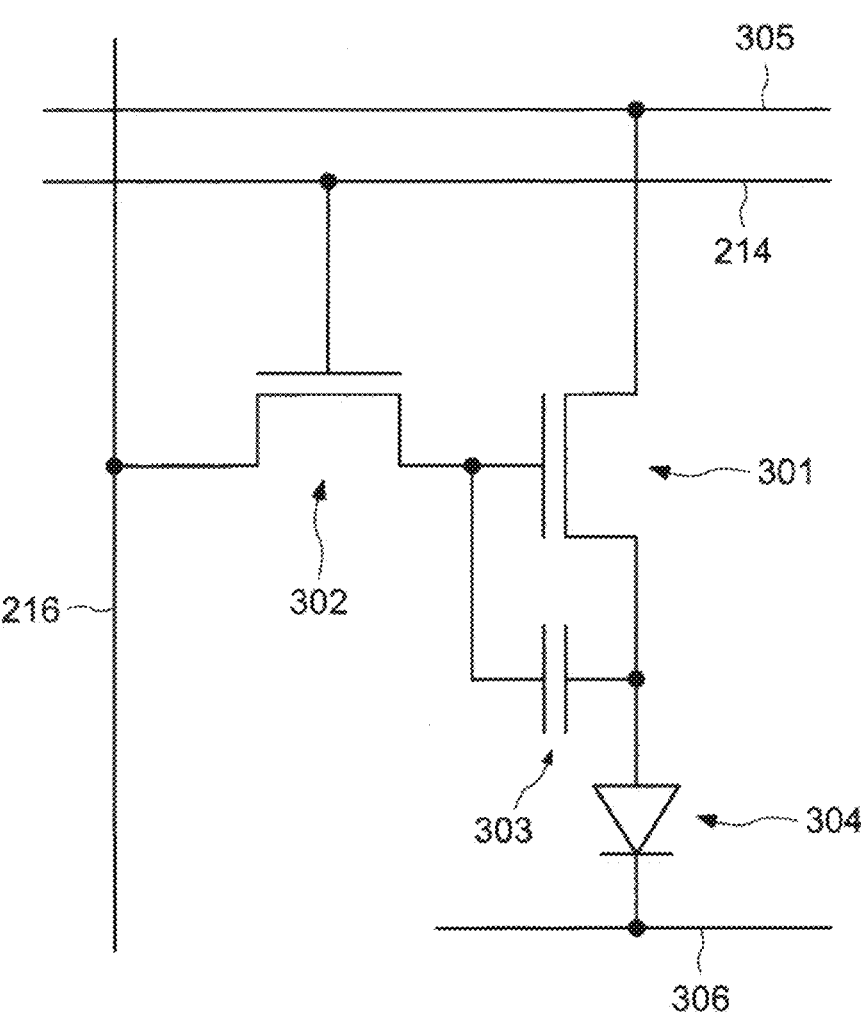
FIG. 3 is a diagram showing a configuration of a pixel circuit in a display device according to an embodiment of the present invention.

FIG. 3 is a diagram showing a configuration of the pixel circuit 300 in the display device 100 according to an embodiment of the present invention. As shown in FIG. 3, the pixel circuit 300 includes elements such as a drive transistor 301, a select transistor 302, a holding capacity 303, and a light-emitting element 304. The drive transistor 301 and the select transistor 302 are formed of a semiconductor device such as a thin film transistor.

A source of the drive transistor 301 is connected to an anode power line 305, and a drain of the drive transistor 301 is connected to one end (anode) of the light-emitting element 304. The other end (cathode) of the light-emitting element 304 is connected to a cathode power line 306. In the present embodiment, a power source voltage higher than that applied to the cathode power line 306 is applied to the anode power line 305.

A gate of the select transistor 302 is connected to the scan signal line 214 and a source of the select transistor 302 is connected to the video signal line 216. A drain of the select transistor 302 is connected to the gate of the drive transistor 301. In addition, the source and drain of the select transistor 302 may be switched depending on the relationship between a voltage applied to the video signal line 216 and a voltage stored in the holding capacity 303.

The holding capacity 303 is connected to the gate and the drain of the drive transistor 301 and the drain of the select transistor 302. A gradation signal that determines the emission intensity of the light-emitting element 304 is supplied to the video signal line 216. A scan signal for selecting a pixel to which the gradation signal is to be written is supplied to the scan signal line 214.

The above-described pixel circuit 300 is arranged in each pixel 212 of the display device 100. In other words, it can be said that the display circuit 210 shown in FIG. 2 is composed of a set of pixel circuits 300.

The description is returned to FIG. 2. The scan signal line drive circuit 220 is coupled to the scan signal line 214 and transmits a scan signal to the scan signal line 214. Specifically, the scan signal is applied to the gate of the select transistor included in the pixel 212, and is used for the switching control of the select transistor. The select transistor is a semiconductor device for selecting whether to allow signal input to the pixel 212. In the present embodiment, although the scan signal line drive circuit 220 is formed using a thin film transistor similar to the plurality of pixels 212, it may be replaced with an IC chip or the like. In addition, in the present embodiment, although two scan signal line drive circuits 220 are arranged on the circuit substrate 200A with the display circuit 210 interposed therebetween, only one of the scan signal line drive circuits 220 may be arranged.

Although not shown, the terminal portion 230 is an assembly of a plurality of terminals connected to the scan signal line drive circuit 220 and the plurality of video signal lines 216. The terminal portion 230 is arranged outside the display circuit 210. The video signal and control signal supplied from the outside are supplied to the display circuit 210 or the scan signal line drive circuit 220 via the terminal portion 230.

The organic EL panel 200 is connected to a flexible printed circuit substrate 240 via the terminal portion 230. The flexible printed circuit substrate 240 is an interface substrate for connecting the circuit substrate 200A of the organic EL panel 200 and an external control circuit (not shown). In the present embodiment, a display control circuit 250 is mounted on the flexible printed circuit substrate 240. The display control circuit 250 is a signal processing circuit that processes various control signals to be transmitted to the scan signal line drive circuit 220 and video signals to be transmitted to the video signal line 216. In the present embodiment, the display control circuit 250 is mounted on the flexible printed circuit substrate 240 in the form of an IC tip.

The flexible printed circuit substrate 240 is a circuit substrate in which a wiring is printed on a flexible substrate made of resin material, and thus can be folded. In the present embodiment, the flexible printed circuit substrate 240 may be folded with a dashed-dotted line 242 so that the flexible printed circuit substrate 240 and a back surface side of the circuit substrate 200A (the side where the display circuit 210 or the like is not formed) overlap. As a result, the organic EL panel 200 and the flexible printed circuit substrate 240 can be compactly housed inside the housing 110.

Figure 4:
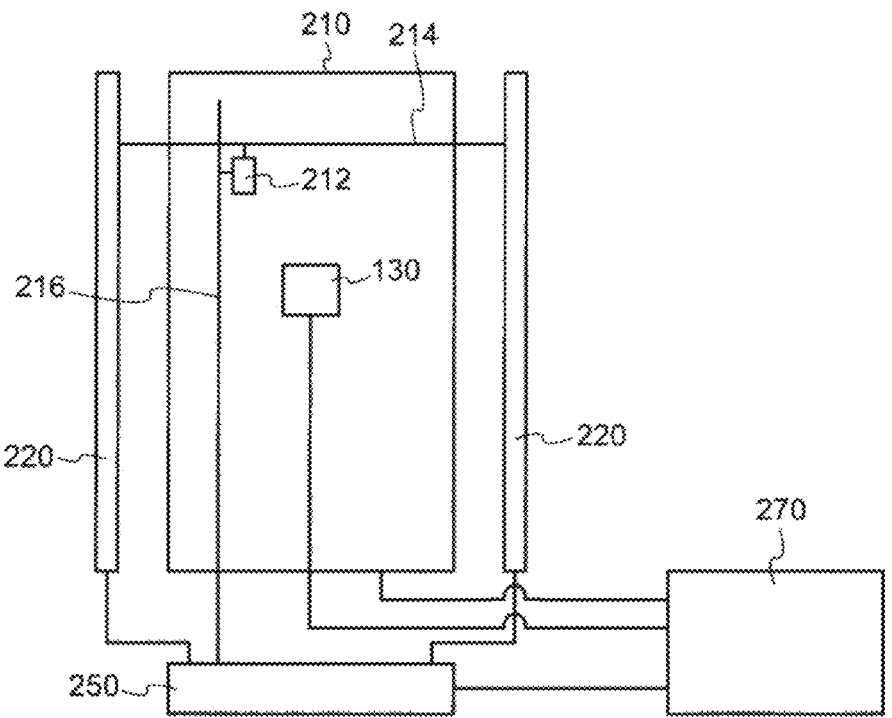
FIG. 4 is a diagram schematically showing a configuration of a display device according to an embodiment of the present invention.

FIG. 4 is a diagram schematically showing a configuration of the display device 100 according to an embodiment of the present invention. As described above, various control signals transmitted to the scan signal line drive circuit 220 is processed by the display control circuit 250. The display control circuit 250 may generate a control signal, such as a start pulse, or may perform a predetermined signal process on the control signal obtained from an external system control circuit 270. In addition, the display control circuit 250 may also perform a predetermined signal process on the video signal obtained from the system control circuit 270.

The system control circuit 270 integrates and controls the display control circuit 250 and the imaging unit 130. In the present embodiment, the control circuit 270 synchronizes the operation of the imaging unit 130 with the operation of the display circuit 210. As a result, for example, when the imaging unit 130 is not used, images are displayed on the entire display screen including the imaging region 130A and the non-imaging region 130B, and when the imaging unit 130 is used, image display can be stopped only in the imaging region 130A. Specifically, when the imaging unit 130 is used, the display circuit 210 can be controlled so that the light emission of the pixel 212 located in the imaging region 130A is stopped and the external light is transmitted through the imaging region 130A.

Next, a difference in the pixel structure between the imaging region 130A and the non-imaging region 130B in the display device 100 will be described. First, the pixel structure in the imaging region 130A will be described.

Figure 5:
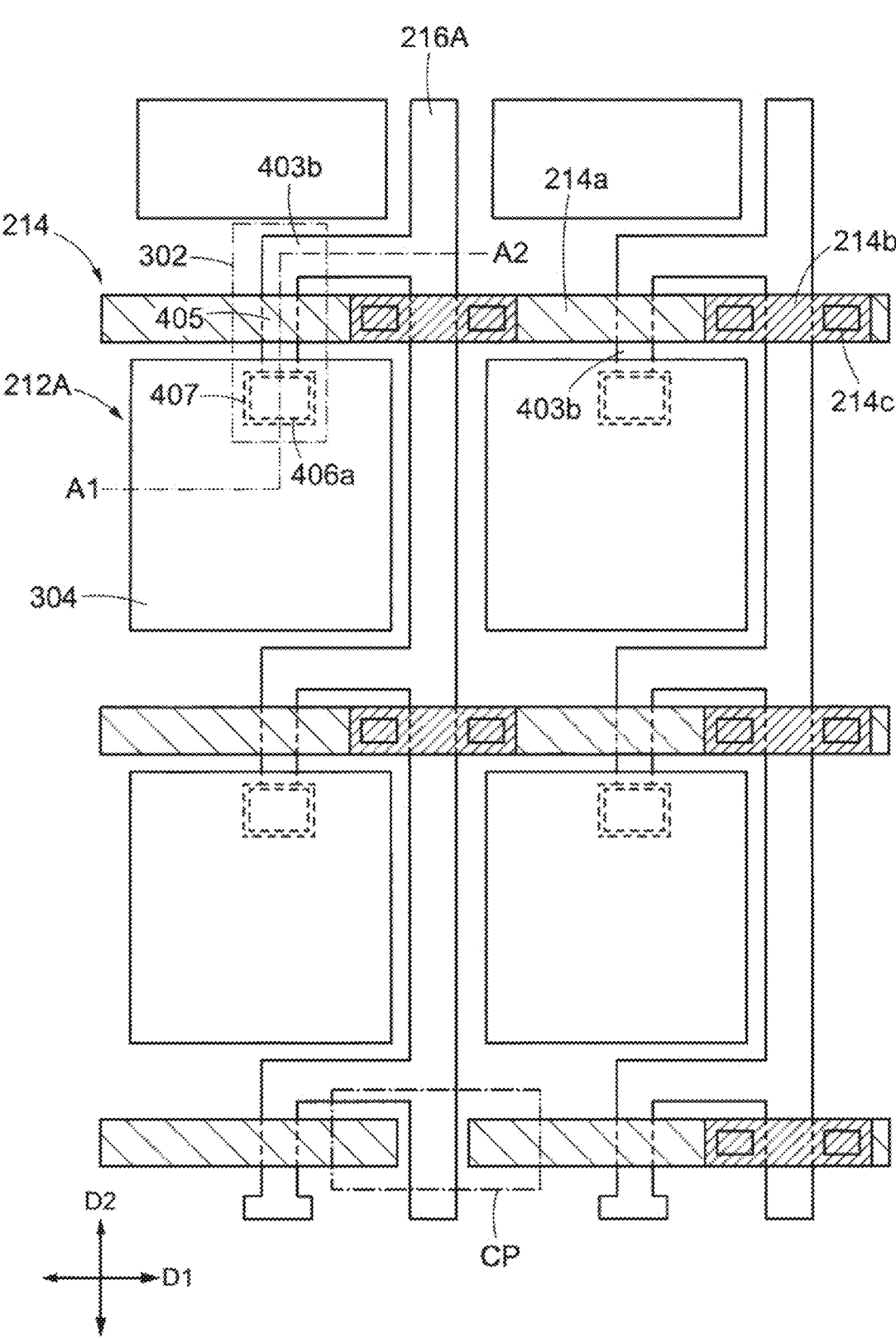
FIG. 5 is a plan view showing a structure of a pixel in an imaging region in a display device according to an embodiment of the present invention.

FIG. 5 is a plan view showing a structure of a pixel 212A in the imaging region 130A in the display device 100 according to an embodiment of the present invention. FIG.

6 is a cross-sectional view showing a structure of the pixel 212A in the imaging region 130A in the display device 100 according to an embodiment of the present invention. Specifically, FIG. 6 corresponds to a cross-sectional view showing a cross-section of the structure of the pixel 212A shown in FIG. 5 cut along a line A1-A2. However, in FIG. 5 and FIG. 6, the configuration of the select transistor 302 described with reference to FIG. 3 will be described, and therefore, illustration of the drive transistor 301, the holding capacity 303, and the anode power line 305 will be omitted.

As shown in FIG. 5, the pixel 212A includes the light-emitting element 304 arranged in a region surrounded by the scan signal line 214 extending in the first direction (direction D1) and a video signal line 216A extending in the second direction (direction D2). The video signal transmitted by the video signal line 216A is input to the pixel 212A via the select transistor 302. Although not shown, a terminal electrode 407 of the select transistor 302 is connected to the gate of the drive transistor 301 (see FIG. 3).

In the imaging region 130A, a conductive portion 403*b* functioning as a source region of the select transistor 302 is configured in the same layer as the video signal line 216A. That is, as shown in FIG. 5, in the select transistor 302 constituting the pixel 212A, the conductive portion 403*b* and the video signal line 216A are integrated. In other words, each of the plurality of pixels 212A in the imaging region 130A is connected by the video signal line 216A configured in the same layer as the conductive portion 403*b* of the select transistor 302.

As shown in FIG. 5, in the imaging region 130A, the scan signal line 214 includes a plurality of wirings 214*a* and a connecting wiring 214*b* that connects each wiring 214*a*. In FIG. 5, each wiring 214*a* is arranged corresponding to each pixel, and is arranged so as not to straddle the video signal line 216A. The connecting wiring 214*b* is electrically connected to each wiring 214*a* via a contact portion 214*c* and interconnects each wiring 214*a* across the video signal line 216A. That is, the connecting wiring 214*b* functions as a bridge wiring that connects the wirings 214*a* separated from each other with the video signal line 216 interposed therebetween.

In FIG. 5, in a region surrounded by a frame line CP, the illustration of the connecting wiring 214*b* is omitted in order to show the positional relationship between the wiring 214*a* and the video signal line 216A. As shown in the region surrounded by the frame line CP, the wirings 214*a* are separated from each other so as to face each other with the video signal line 216A interposed therebetween. The connecting wiring 214*b* electrically connects the wirings 214*a* separated from each other in this way.

Although details will be described later, the conductive portion 403*b* is a portion of an oxide semiconductor layer to which conductivity is imparted in the process of adding impurities. Therefore, an impurity needs to be added to the entire oxide semiconductor layer used as the video signal line 216A. However, if the wiring 214*a* overlaps the portion of the oxide semiconductor layer used as the video signal line 216A, no impurity is added to the portion overlapping the wiring 214*a*, and resistance is higher than that of the portion where the impurity is added. Therefore, the oxide semiconductor layers cannot function as the video signal line 216A.

From the above, in the present embodiment, each wiring 214*a* is arranged so as not to overlap the video signal line 216A, and the impurity is added to the oxide semiconductor layer while the oxide semiconductor layer functioning as the video signal line 216A is exposed. As a result, conductivity can be imparted to the entire oxide semiconductor layer functioning as the video signal line 216A. In the present embodiment, the scan signal line 214 is formed by forming the oxide semiconductor layer functioning as the video signal line 216A (the conductive portion 403b) and then electrically connecting the separated wirings 214a by the connecting wiring 214b.

Figure 6:
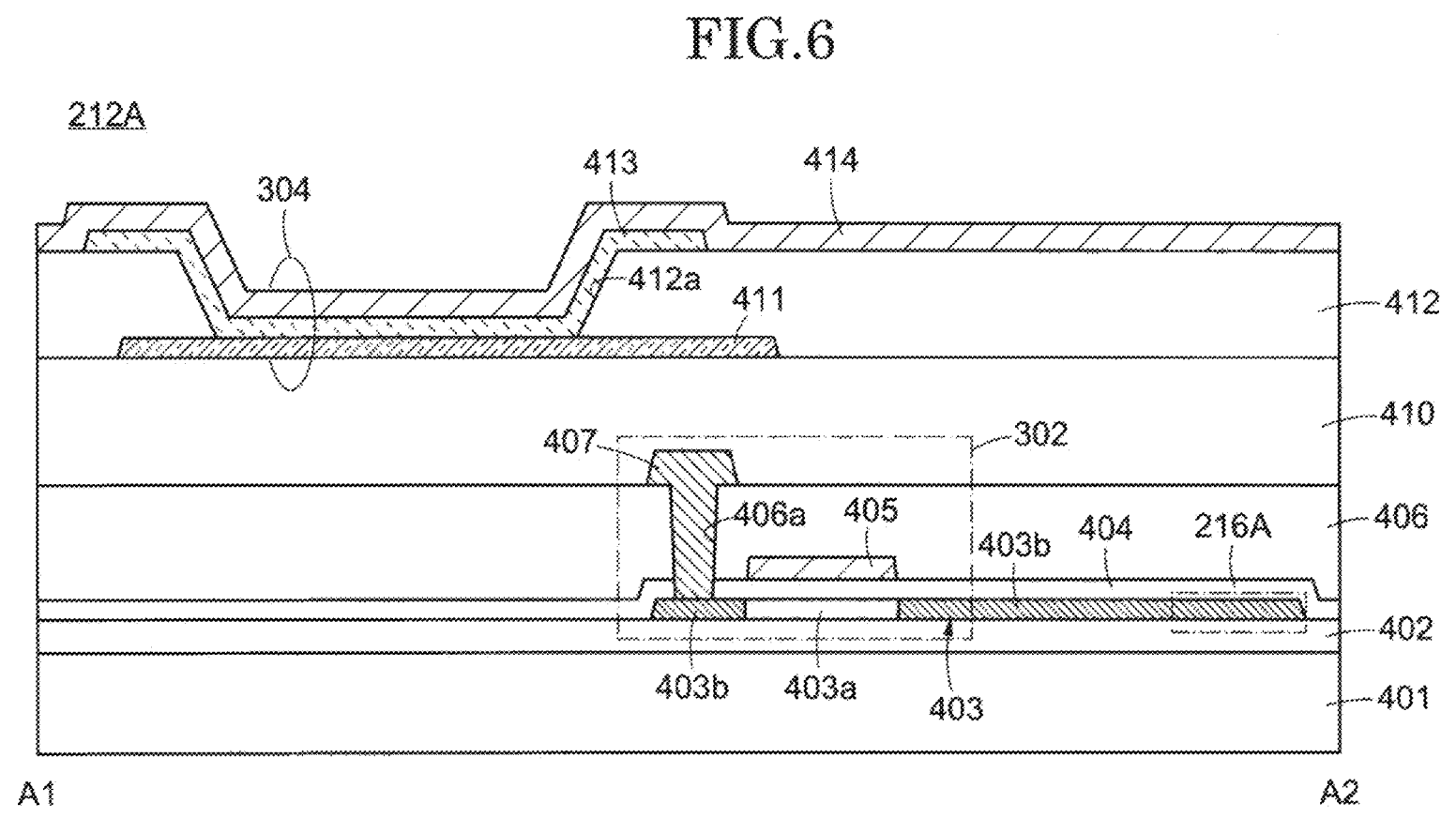

As shown in FIG. 6, the select transistor 302 is arranged on a substrate 401. The substrate 401 is a substrate having light transmittance, and for example, a glass substrate or a resin substrate can be used. A base layer 402 is composed of a silicon oxide layer, a silicon nitride layer, or a stacked film of a silicon oxide layer and a silicon nitride layer. The base layer 402 serves to prevent entry of impurities or the like from the substrate 401.

The select transistor 302 of the present embodiment includes an oxide semiconductor layer 403 made of an oxide semiconductor having a polycrystalline structure. For example, a metal oxide containing two or more metals including indium (In) is used as the oxide semiconductor. Typically, the oxide semiconductor has light transmittance and is transparent to visible light.

The oxide semiconductor layer 403 includes a channel portion 403a and the conductive portion 403b. The channel portion 403a functions as a channel region of the select transistor 302, and the conductive portion 403b functions as a source region or drain region of the select transistor 302. As shown in FIG. 5 and FIG. 6, in the imaging region 130A, the conductive portion 403b is extended to function as the video signal line 216A. For convenience of explanation, in FIG. 5 and FIG. 6, the conductive portion 403b connected to the video signal line 216A may be referred to as the source region, and the conductive portion 403b connected to the terminal electrode 407 may be referred to as the drain region.

The oxide semiconductor layer 403 is covered with a gate insulating layer 404 composed of a silicon oxide layer. A gate electrode 405 composed of a metal layer is arranged directly above the channel portion 403a of the oxide semiconductor layer 403 via the gate insulating layer 404. The gate electrode 405 corresponds to a part of the scan signal line 214 that overlaps the channel portion 403a. Therefore, the scan signal line 214 is also comprised of the metal layer.

An interlayer insulating layer 406 composed of a silicon oxide layer, a silicon nitride layer, or a stacked film thereof is arranged on the gate electrode 405 and the gate insulating layer 404. A contact hole 406a is arranged in the interlayer insulating layer 406, and the terminal electrode 407 and the conductive portion 403b (drain region) are connected via the contact hole 406a.

A planarization layer 410 composed of resin material is arranged on the select transistor 302. The light-emitting element 304 is arranged on the planarization layer 410. Although not shown in FIG. 6, the light-emitting element 304 is connected to the drive transistor 301 described with reference to FIG. 3. Specifically, a pixel electrode 411 functioning as an anode electrode of the light-emitting element 304 is connected to the drain of the drive transistor 301.

The light-emitting element 304 includes the pixel electrode 411 having a structure in which a transparent conductive film such as ITO and a metal layer such as silver are stacked. An end portion of the pixel electrode 411 is covered with a resin layer 412 called a bank or rib. An opening 412a arranged in the resin layer 412 exposes a portion of the surface of the pixel electrode 411. The outer shape of the pixel electrode 411 exposed by the opening 412a defines a light-emitting region of the light-emitting element 304. A light-emitting layer 413 and a common electrode 414 are arranged inside the opening 412a. The common electrode 414 functions as a cathode electrode of the light-emitting element 304 and is arranged across the plurality of pixels 212A. As described in FIG. 3, the common electrode 414 is connected to the cathode power line 306 (not shown). On the other hand, the pixel electrode 411 and the light-emitting layer 413 are individually arranged for each pixel 212A. Different materials are used for the light-emitting layer 413 depending on the display color of the pixel.

As described above, in the present embodiment, the source region (the conductive portion 403b) of the select transistor 302 and the video signal line 216A are integrally formed with respect to the pixel 212A arranged in the imaging region 130A. That is, the conductive portion 403b and the video signal line 216 are formed in the same layer. Specifically, the conductive portion 403b and the video signal line 216 are composed of the oxide semiconductor in which conductivity has imparted. The select transistor 302 of the present embodiment can be used as a wiring because resistance of the conductive portion 403b is significantly lower than that of the conventional one. Specifically, since the sheet resistance of the conductive portion 403b is 1000 $\Omega$/sq. or less (preferably 500 $\Omega$/sq. or less), it can be used as the video signal line 216.

Since the display device 100 of the present embodiment uses the video signal line 216A composed of the oxide semiconductor in the imaging region 130A, the video signal line does not block visible light. In addition, the video signal line 216A is formed at the same time when forming the source region and drain region of the select transistor 302, so that light transmittance can be imparted to the video signal line 216A with a simple structure. As described above, according to the present embodiment, the transmittance of the display panel (the organic EL panel 200) can be improved with a simple structure.

The above-described pixel structure in the imaging region 130A is realized by reducing resistance of the oxide semiconductor to a level that can be used as a wiring. Specifically, it is realized by reducing the resistance of the conductive portion 403b of the select transistor 302, a semiconductor device using the oxide semiconductor. The configuration and manufacturing method of the semiconductor device (for example, the thin film transistor) used in the present embodiment will be described later.

In addition, a wiring using the conductive portion 403b composed of the oxide semiconductor has a resistance relatively higher than the wiring composed of metal material. However, in the present embodiment, for a part of region (specifically, the imaging region 130A) of the organic EL panel 200, the video signal line 216A and the conductive portion 403b of the select transistor 302 are formed in the same layer. As described above, in the case where the conductive portion 403b is used as a wiring limited to a particular region, the conductive portion 403b can sufficiently function as a wiring even if the sheet resistance is higher than that of the metal layer.

Next, the pixel structure of the non-imaging region 130B will be described.

Figure 7:
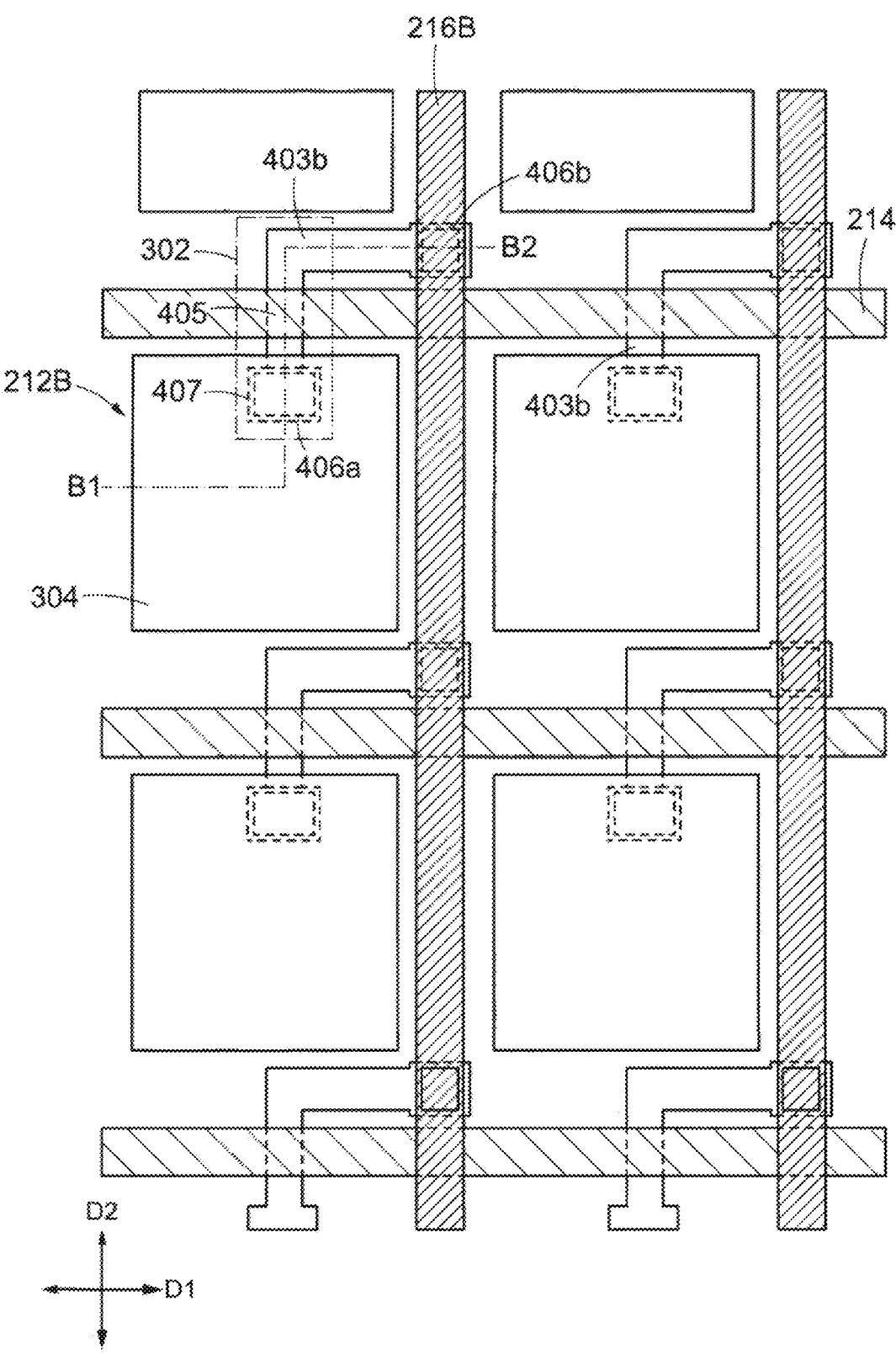
FIG. 7 is a plan view showing a structure of a pixel in a non-imaging region in a display device according to an embodiment of the present invention.
Figure 8:
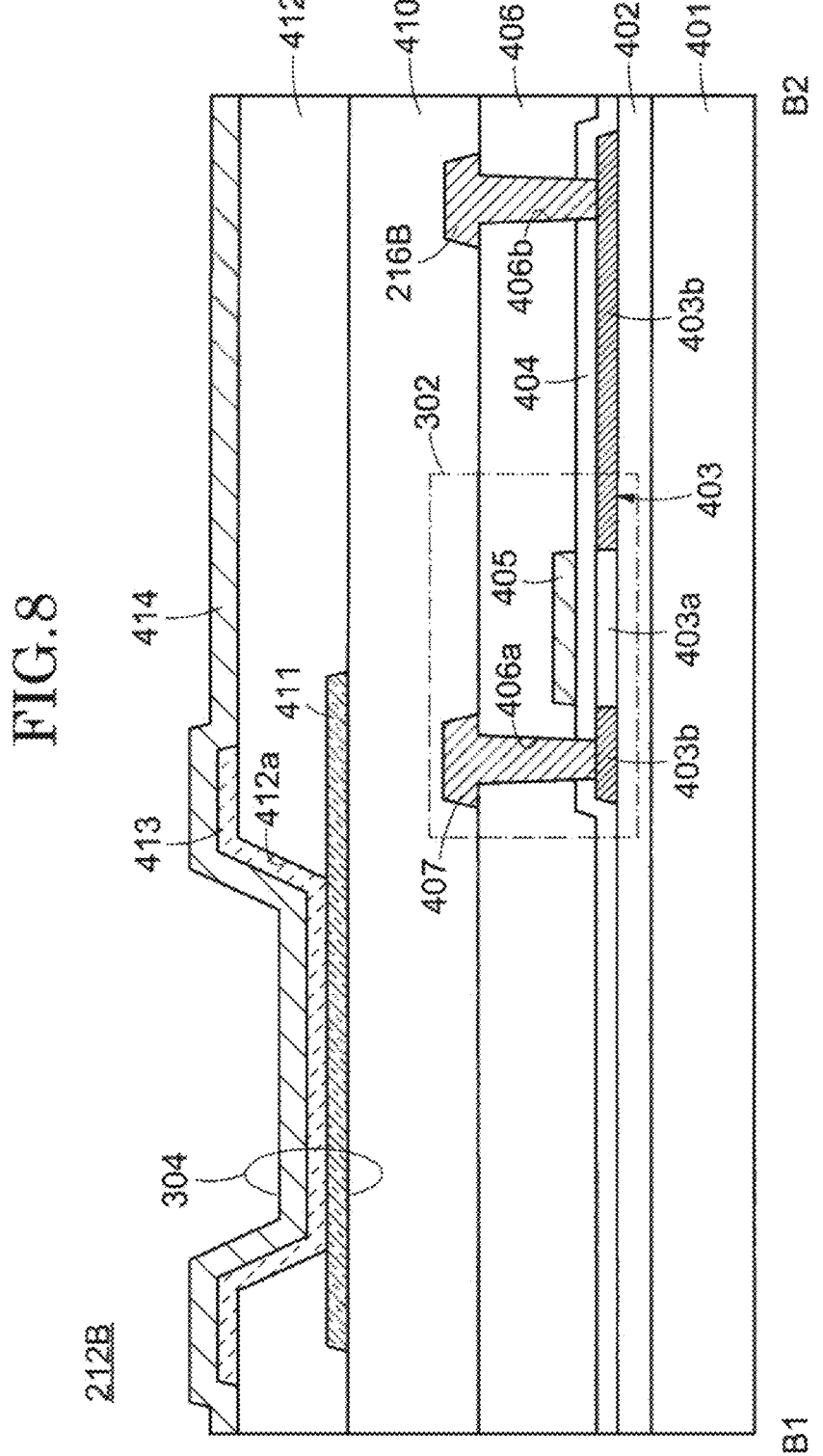
FIG. 8 is a cross-sectional view showing a structure of a pixel in a non-imaging region in a display device according to an embodiment of the present invention.

FIG. 7 is a plan view showing a structure of a pixel 212B in the non-imaging region 130B in the display device 100 according to an embodiment of the present invention. FIG. 8 is a cross-sectional view showing a structure of the pixel 212B in the non-imaging region 130B in the display device 100 according to an embodiment of the present invention. Specifically, FIG. 8 corresponds to a cross-sectional view showing a cross section of the structure of the pixel 212B shown in FIG. 7 cut along a line B1-B2. However, in FIG. 7 and FIG. 8, the drive transistor 301, the holding capacity 303, and the anode power line 305 are not shown in order to focus on the structure of the select transistor 302 described with reference to FIG. 3.

As shown in FIG. 7, the pixel structure in the non-imaging region 130B is almost the same as the pixel structure in the imaging region 130A shown in FIG. 5. That is, the pixel 212B includes the light-emitting element 304 arranged in a region surrounded by the scan signal line 214 extending in the first direction (direction D1) and a video signal line 216B extending in the second direction (direction D2). The video signal transmitted by the video signal line 216B is inputted to the pixel 212B via the select transistor 302. Although not shown, the terminal electrode 407 of the select transistor 302 is connected to the gate of the drive transistor 301.

The difference from FIG. 5 is that, in the non-imaging region 130B, the conductive portion 403b functioning as the source region of the select transistor 302 is connected to the video signal line 216B composed of metal material. That is, as shown in FIG. 7, each of the plurality of pixels 212B in the non-imaging region 130B is connected by the video signal line 216B composed of the metal layer connected to the conductive portion 403b of the select transistor 302.

As shown in FIG. 8, the video signal line 216B is connected to the conductive portion 403b functioning as the source region of the select transistor 302 via a contact hole 406b arranged in the interlayer insulating layer 406. The video signal line 216B is formed in the same layer as the terminal electrode 407 connected to the drain region of the select transistor 302. For example, the video signal line 216B may be composed of a stacked structure of titanium layer/aluminum layer/titanium layer.

As shown in FIG. 1, the non-imaging region 130B has a larger region than the imaging region 130A. Therefore, the video signal line 216B in the non-imaging region 130B is relatively longer than the video signal line 216A in the imaging region 130A. Therefore, in order to prevent the signal delay of the video signal, it is desirable to form the video signal line 216B using metal material in the non-imaging region 130B.

Figure 9:
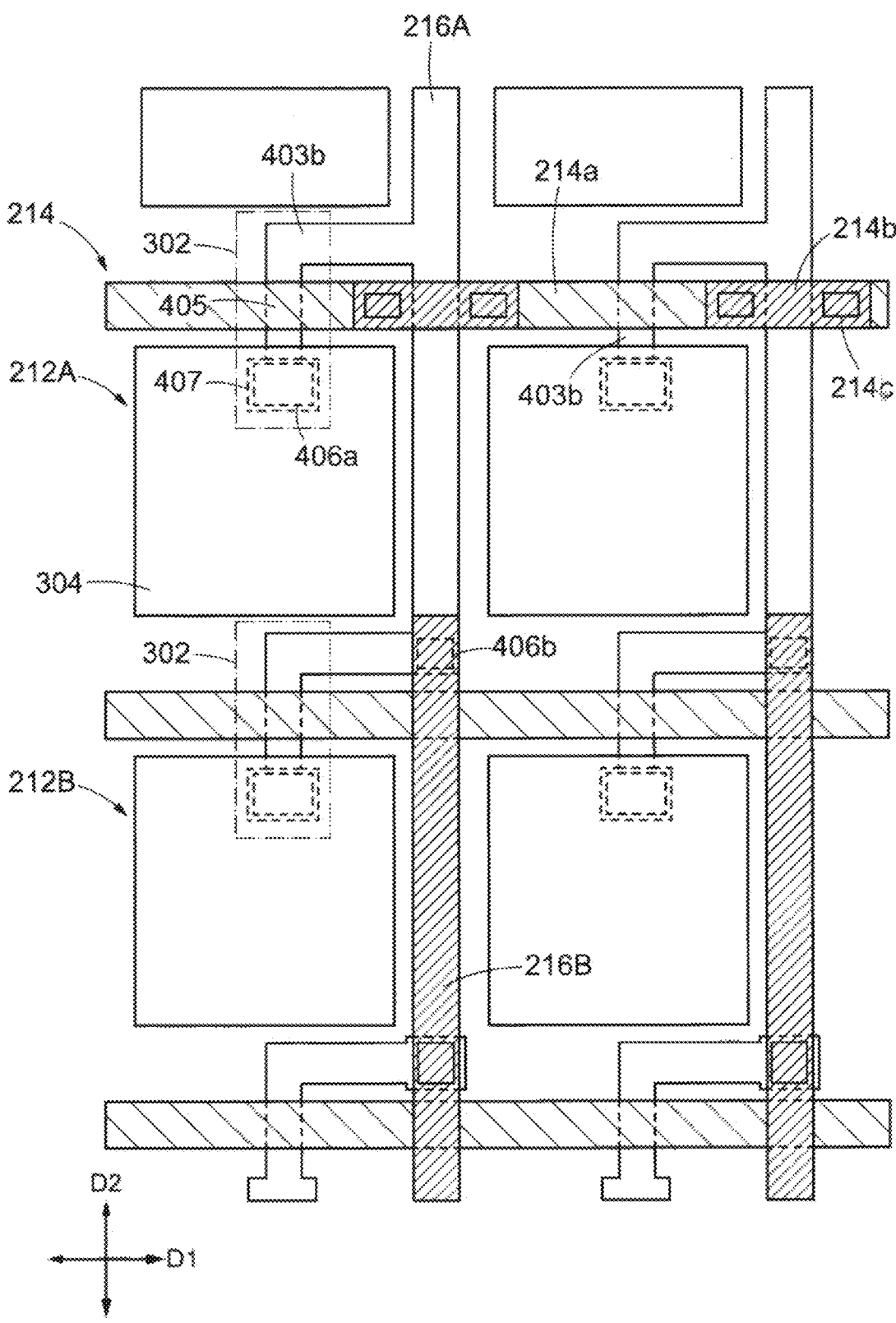
FIG. 9 is a plan view showing a pixel structure near a border between an imaging region and a non-imaging region in a display device according to an embodiment of the present invention.

FIG. 9 is a plan view showing a pixel structure near a border between the imaging region 130A and the non-imaging region 130B in the display device 100 according to an embodiment of the present invention. As shown in FIG. 9, the video signal line 216A and the video signal line 216B are electrically connected near the border between the imaging region 130A and the non-imaging region 130B. A connection structure of the video signal line 216A and the video signal line 216B is the same as a connection structure of the conductive portion 403b functioning as the source region and the video signal line 216B described with reference to FIG. 8. In addition, a configuration of the scan signal line 214 is similar to the structure shown in FIG. 5. Specifically, the plurality of wirings 214a is connected to each other by the connecting wiring 214b arranged across the video signal line 216A and functions as the scan signal line 214 as a whole. In addition, the connecting wiring 214b may be formed in the same layer as the video signal line 216B.

In the display device 100 of the present embodiment, the video signal line 216 arranged in the circuit substrate 200A of the organic EL panel 200 includes the video signal line 216A composed of oxide semiconductor material and the video signal line 216B composed of metal material. In other words, the display panel in the display device 100 of the present embodiment includes the region (the imaging region 130A) including the video signal line 216A composed of oxide semiconductor material and the region (the non-imaging region 130B) including the video signal line 216B composed of metal material.

In the present embodiment, in the imaging region 130A, the oxide semiconductor layer is used as the source region and drain region of the semiconductor device (the drive transistor 301 and the select transistor 302) and as the conductive layer forming the video signal line 216A, and the metal oxide is used as the conductive layer forming the light-emitting element 304. Further, the above-described oxide semiconductor or metal oxide can be used as the conductive layer forming the holding capacity 303. Therefore, the transmittance of the organic EL panel 200 can be improved with a simple structure and external light can be sufficiently captured when the imaging element 132 performs the imaging process. On the other hand, in the display device 100 of the present embodiment, since a wiring composed of metal material is used as the video signal line 216B in the non-imaging region 130B, the effect of the signal delay can be suppressed. As a result, the display device 100 of the present embodiment achieves an improvement in imaging performance without causing the signal delay by arranging the video signal line 216A locally composed of the oxide semiconductor in the imaging region 130A that requires a relatively higher transmittance.

In the present embodiment, an example in which the wiring composed of metal material is used as the video signal line 216B in the non-imaging region 130B is shown. However, if the resistance of the conductive portion 403b of the semiconductor layer is sufficiently low to withstand practical use, a wiring composed of the oxide semiconductor can be used as the video signal line 216B in the non-imaging region 130B.

As described above, the structure of the present embodiment is achieved by making the resistance of the conductive portion 403b composed of the oxide semiconductor sufficiently low. Therefore, the configuration and manufacturing method of the semiconductor device used in the present embodiment will be described below.

[Configuration of Semiconductor Device 10]

Figure 10:
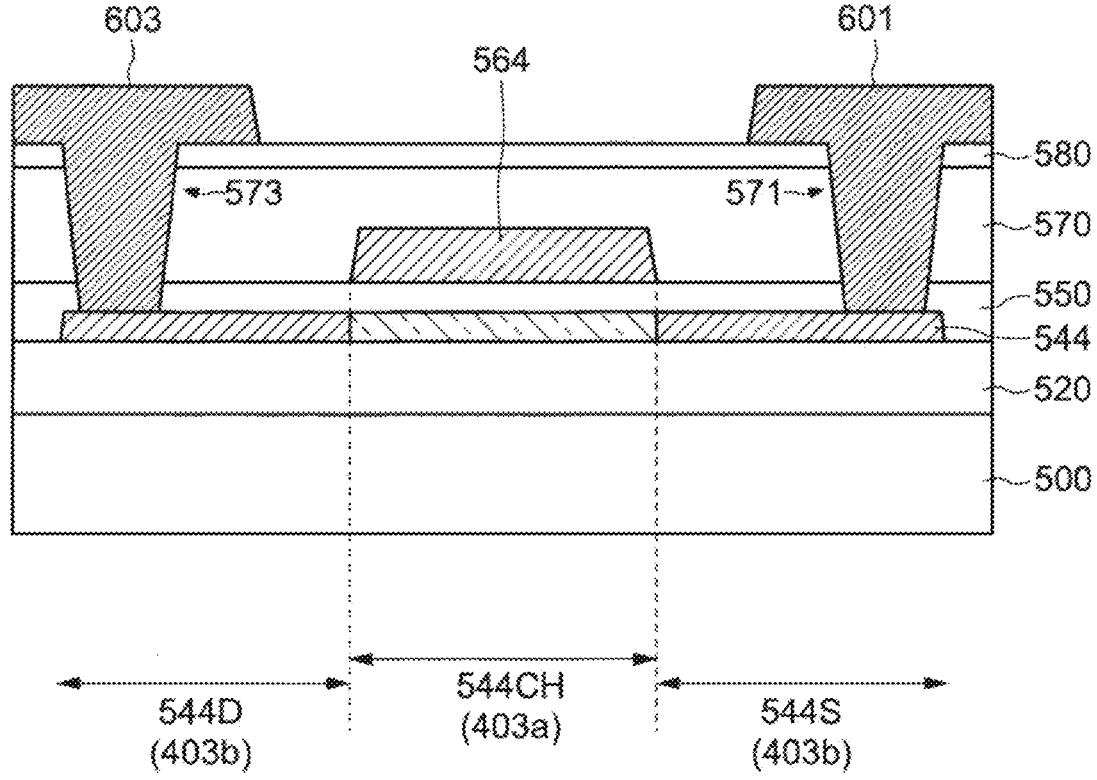
FIG. 10 is a cross-sectional view showing an outline of a semiconductor device according to an embodiment of the present invention.
Figure 11:
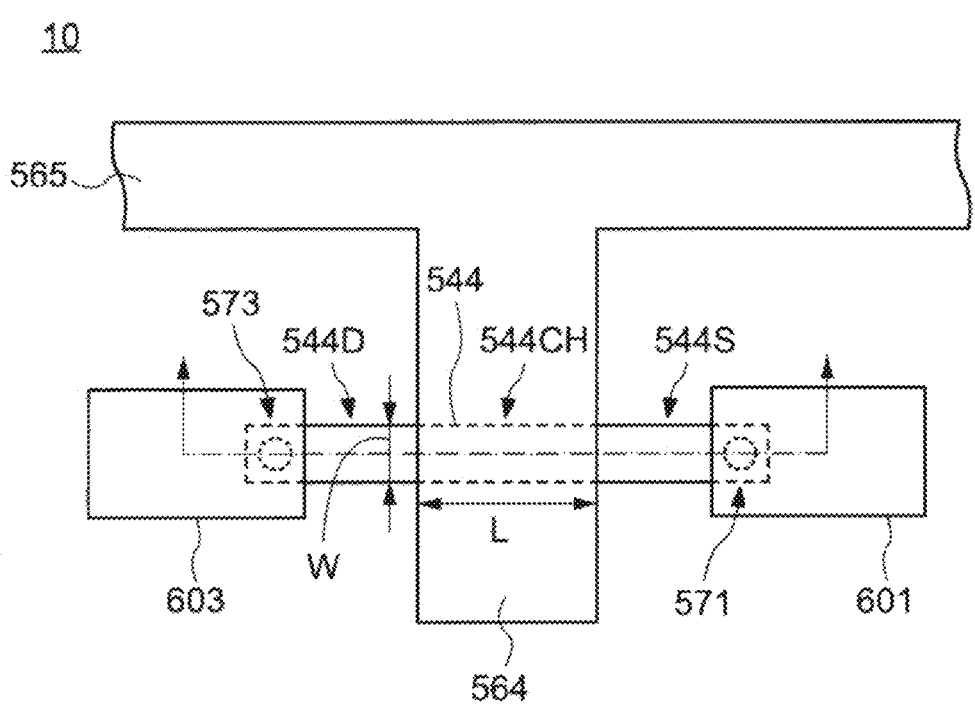
FIG. 11 is a cross-sectional view showing an outline of a semiconductor device according to an embodiment of the present invention.
Figure 11:
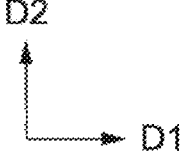

The configuration of a semiconductor device 10 used in the display device 100 of the present embodiment will be described with reference to FIG. 10 and FIG. 11. FIG. 10 is a cross-sectional view schematically showing an outline of the semiconductor device 10 according to an embodiment of the present invention. FIG. 11 is a plan view showing an outline of the semiconductor device 10 according to an embodiment of the present invention. In addition, a cross section cut along a dashed-dotted line shown in FIG. 11 corresponds to the cross-sectional view shown in FIG. 10.

As shown in FIG. 10, the semiconductor device 10 is arranged above a substrate 500. The semiconductor device 10 includes a base film 520, an oxide semiconductor layer 544, a gate insulating layer 550, a gate electrode 564, an insulating layer 570, an insulating layer 580, a source electrode 601, and a drain electrode 603. However, as described above, the source electrode 601 is omitted from the select transistor 302 arranged in the imaging region 130A (see FIG. 6).

The base film 520 is arranged on the substrate 500. The oxide semiconductor layer 544 is arranged on the base film 520. The oxide semiconductor layer 544 is in contact with the base film 520. A surface of the main surface of the oxide semiconductor layer 544 that is in contact with the base film 520 is referred to as a lower surface. The base film 520 has a function as a barrier film that shields impurities that diffuse from the substrate 500 toward the oxide semiconductor layer 544.

The oxide semiconductor layer 544 has light transmittance. In addition, the oxide semiconductor layer 544 is divided into a source region 544S, a drain region 544D, and a channel region 544CH. The channel region 544CH is a region vertically below the gate electrode 564 of the oxide semiconductor layer 544. The source region 544S is a region of the oxide semiconductor layer 544 that does not overlap the gate electrode 564 and is closer to the source electrode 601 than the channel region 544CH. The drain region 544D is a region of the oxide semiconductor layer 544 that does not overlap the gate electrode 564 and is closer to the drain electrode 603 than the channel region 544CH. The channel region 544CH corresponds to the channel portion 403a shown in FIG. 6 and FIG. 8, and the source region 544S and the drain region 544D correspond to the conductive portion 403b shown in FIG. 6 and FIG. 8, respectively.

The gate electrode 564 is composed of the metal layer and faces the oxide semiconductor layer 544. The gate insulating layer 550 is arranged between the oxide semiconductor layer 544 and the gate electrode 564. The gate insulating layer 550 is in contact with the oxide semiconductor layer 544. A surface of the main surface of the oxide semiconductor layer 544 that is in contact with the gate insulating layer 550 is referred to as an upper surface. A surface between the upper and lower surfaces is referred to as a side surface. The insulating layer 570 and the insulating layer 580 are arranged on the gate insulating layer 550 and the gate electrode 564, respectively. Contact holes 571 and 573 that reach the oxide semiconductor layer 544 are arranged in the insulating layer 570 and the insulating layer 580. The source electrode 601 is in contact with the source region 544S via the contact hole 571. The drain electrode 603 is in contact with the drain region 544D via the contact hole 573.

The oxide semiconductor layer 544 has a polycrystalline structure containing a plurality of crystal grains. As will be described later, using Poly-OS (Poly-crystalline Oxide Semiconductor) technique makes it possible to form the oxide semiconductor layer 544 having the polycrystalline structure. In the following explanation, an oxide semiconductor itself having a polycrystalline structure may be referred to as a Poly-OS.

In the present embodiment, the oxide semiconductor layer 544 contains two or more metals including indium, and the ratio of indium in the two or more metals is 50% or more. A gallium (Ga) element, a zinc (Zn) element, an aluminum (Al) element, a hafnium (Hf) element, an yttrium (Y) element, a zirconium (Zr) element, and a lanthanoid are used as metal elements other than the indium element. However, without being limited to this example, the oxide semiconductor layer 544 may contain metal elements other than those described above.

In addition, the source region 544S and the drain region 544D may contain elements other than the metal elements described above. Although details will be described later, the source region 544S and the drain region 544D have lower resistivity than the channel region 544CH. Such a decrease in resistivity is realized in a process of adding an element such as argon (Ar), phosphorus (P), or boron (B) (hereinafter, referred to as "impurity element") to the oxide semiconductor layer 544.

The concentration of the impurity element contained in the source region 544S and the drain region 544D is preferably $1 \times 10^{18}$ cm$^{-3}$ or more and $1 \times 10^{21}$ cm$^{-3}$ or less when measured by SIMS spectrometry (secondary ion-mass spectrometry). In the case where the source region 544S and the drain region 544D contain the impurity element at $1 \times 10^{18}$ cm$^{-3}$ or more and $1 \times 10^{21}$ cm$^{-3}$ or less, it is presumed that the impurity element was intentionally added by an ion implantation method or an ion doping method. However, the source region 544S and the drain region 544D may contain an impurity element other than argon (Ar), phosphorus (P), or boron (B) at a concentration of less than $1 \times 10^{18}$ cm$^{-3}$. In addition, the inclusion of an impurity element in the channel region 544CH affects the properties of the semiconductor device 10. Therefore, the concentration of the impurity element contained in the channel region 544CH is preferably less than $1 \times 10^{18}$ cm$^{-3}$ (more preferably $1 \times 10^{16}$ cm$^{-3}$ or less).

The gate electrode 564 has a function as a top gate of the semiconductor device 10. The gate insulating layer 550 has a function as a gate insulating layer for the top gate, and has a function of releasing oxygen by heat treatment in a manufacturing process. The insulating layer 570 and the insulating layer 580 insulate between the gate electrode 564 and the source electrode 601 and between the gate electrode 564 and the drain electrode 603, respectively. As a result, parasitic capacitances generated between the gate electrode 564 and the source electrode 601 and between the gate electrode 564 and the drain electrode 603 can be reduced.

As shown in FIG. 11, a gate wiring 565 extends in the first direction (direction D1). A portion of the gate wiring 565 branches toward the second direction (direction D2) and overlaps the oxide semiconductor layer 544. A portion of the gate wiring 565 that overlaps the oxide semiconductor layer 544 functions as the gate electrode 564. A length in the first direction (direction D1) of a region (that is, the channel region 544CH) where the oxide semiconductor layer 544 and the gate electrode 564 overlap is a channel length (L), and a length in the second direction (direction D2) is a channel width (W).

[Crystal Structure of Oxide Semiconductor Layer]

The oxide semiconductor layer 544 contains the Poly-OS. Particle diameter of the crystal grain contained in the Poly-OS observed from the upper surface of the oxide semiconductor layer 544 (or a thickness direction of the oxide semiconductor layer 544) is 0.1 μm or more, preferably 0.3 μm or more, and more preferably 0.5 μm or more. For example, a particle diameter of the crystal grain can be obtained using a cross-sectional SEM observation, a cross-sectional TEM observation, or an Electron Back Scattered Diffraction (EBSD) method.

In the Poly-OS, the plurality of crystal grains may have one type of crystal structure, or may have a plurality of types of crystal structures. The crystal structure of the Poly-OS can be identified using an electron diffraction method, an XRD method, or the like. That is, the crystal structures of the oxide semiconductor layer 544 and an oxide conductive layer 164 can be identified using the electron diffraction method, the XRD method, or the like.

The crystal structure of the oxide semiconductor layer 544 preferably cubic. The cubic crystal has a high symmetry crystal structure, and even when an oxygen deficiency is generated in the oxide semiconductor layer 544, the structural relaxation hardly occurs, and the crystal structure is stable. As described above, the oxide semiconductor layer 544 contains two or more metals including indium, and the ratio of indium in the two or more metals is 50% or more. Increasing the ratio of the indium element makes it possible to control the crystal structure of each of the plurality of crystal grains, and the oxide semiconductor layer 544 having a cubic crystal structure can be formed.

As shown in FIG. 10, the oxide semiconductor layer 544 includes the channel portion 403a (see FIG. 6 and FIG. 8) corresponding to the channel region 544CH, and the conductive portion 403b (see FIG. 6 and FIG. 8) corresponding to the source region 544S and the drain region 544D. In the oxide semiconductor layer 544, the channel portion 403a has a first crystal structure and the conductive portion 403b has a second crystal structure. Although the conductive portion 403b has a higher electric conductivity than the channel portion 403a, the second crystal structure is the same as the first crystal structure. In this case, the two crystal structures are the same means that the crystal systems are the same. For example, in the case where the crystal structure of the oxide semiconductor layer 544 is cubic, the crystal structure of the first crystal structure of the channel portion 403a and the crystal structure of the conductive portion 403b are both cubic and identical. For example, the first crystal structure and the second crystal structure can be identified by a microelectron diffraction method.

In addition, in a predetermined crystal orientation, a plane interval d of the first crystal structure and a plane interval d of the second crystal structure are substantially the same. In this case, two plane intervals d are substantially the same means that one plane interval d is 0.95 times or more and 1.05 times or less the other plane interval d. Alternatively, it means the case where two diffraction patterns are almost identical in the microelectron diffraction method.

There may be no grain boundaries between the channel portion 403a and the conductive portion 403b. In addition, the channel portion 403a and the conductive portion 403b may be included in one crystal grain. In other words, the change from the channel portion 403a to the conductive portion 403b may be a continual change in the crystal structure.

Figures 12A, 12B, 12C:
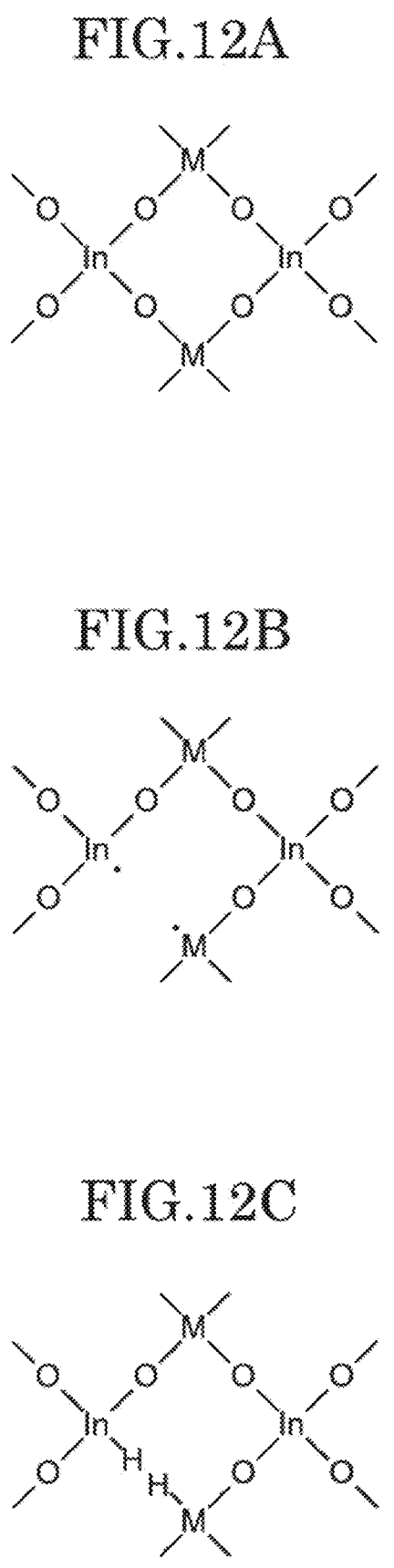

FIG. 12A to FIG. 12C are schematic diagrams for explaining the coupling condition of Poly-OS contained in the conductive portion 403b of the oxide semiconductor layer 544. FIG. 12A to FIG. 12C show Poly-OS containing indium atoms (In atoms) and metal atoms (M atoms) that differ from the In atoms.

In the Poly-OS shown in FIG. 12A, each of the In atom and the metal atom M is bonded to an oxygen atom (O atom). In the crystal structure of the Poly-OS shown in FIG. 12A, in the conductive portion 403b, in order to increase the electric conductivity than the channel portion 403a, the bond between the In atoms and the O atoms (or the metal atoms M and O atoms) is broken, and oxygen deficiencies in which the O atoms are desorbed are generated (see FIG. 12B). Since the Poly-OS contains crystal grains with large particle diameter, long-range order is easily maintained. Therefore, even if an oxygen deficiency is generated, the structural relaxation hardly occurs, and the positions of the In atoms and metal atoms M hardly change. In the state shown in FIG. 12B, in the case where hydrogen is present, dangling bonds of In atoms and dangling bonds of the metal atoms M in oxygen deficiency are bonded to the hydrogen atoms (H atoms) and stabilized (see FIG. 12C). Since the H atoms in oxygen deficiency function as donors, a carrier concentration of the conductive portion 403b increases.

In addition, as shown in FIG. 12C, in Poly-OS, even if H atoms are bonded in oxygen deficiency, the positions of the In atoms and the metal atoms M hardly change. Therefore, the second crystal structure of the conductive portion 403b does not change from the crystal structure of the Poly-OS without oxygen deficiency. That is, the second crystal structure of the conductive portion 403b is the same as the first crystal structure of the channel portion 403a.

Figure 13:
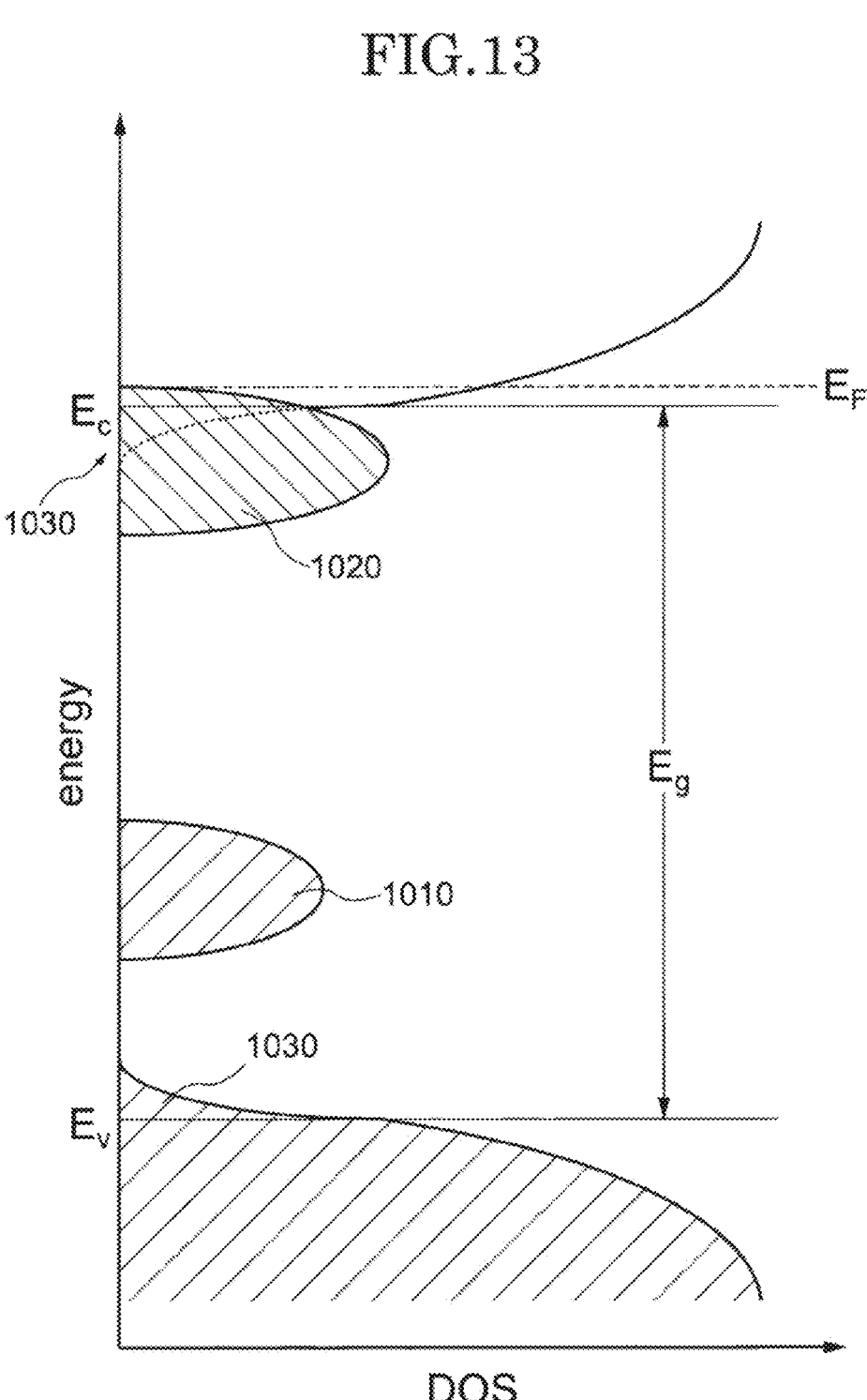
FIG. 13 is a band diagram for explaining a band structure of a conductive portion of an oxide semiconductor layer.

FIG. 13 is a band diagram for explaining a band structure of the conductive portion 403b of the oxide semiconductor layer 544.

As shown in FIG. 13, in the Poly-OS of the conductive portion 403b, a first energy level 1010 and a second energy level 1020 are included in a bandgap $E_g$. In addition, a tail level 1030 is included in the vicinity of an energy level $E_V$ at an upper end of the valence band and in the vicinity of an energy level $E_C$ at a lower end of the conduction band. The first energy level 1010 is a deep trap level present in the bandgap $E_g$ and is due to oxygen deficiency. The second energy level 1020 is a donor level present in the vicinity of the lower end of the conduction band and is due to the hydrogen atoms bonded in the oxygen deficiency. The tail level 1030 is due to a disturbance of long-range order.

Although the Poly-OS in the conductive portion 403b contains oxygen deficiency, it has a crystal structure, and long-range order is maintained. In addition, in the Poly-OS in the conductive portion 403b, hydrogen atoms can be bonded in oxygen deficiency without causing a structural disturbance. Therefore, while suppressing Density of State (DOS) of the tail level 1030, the DOS of the second energy level 1020 can be increased. Therefore, the DOS of the second energy level 1020 is larger than the DOS of the tail level 1030 in the vicinity of the lower end of the conduction band, and the DOS of the second energy level 1020 can extend beyond the energy level $E_C$ at the lower end of the conduction band. That is, the Fermi level $E_F$ exceeds the energy level $E_C$ at the lower end of the conduction band, and the Poly-OS in the conductive portion 403b has a metallic property.

As described above, the Poly-OS in the conductive portion 403b has a metallic property unlike the conventional oxide semiconductor. Therefore, the resistance of the conductive portion 403b can be sufficiently reduced by generating oxygen deficiency. The sheet resistance of the conductive portion 403b is 1000 Ω/sq. or less, preferably 500 Ω/sq. or less, and more preferably 250 Ω/sq. or less.

As described above, in the present embodiment, the resistance of the source region 544S of the oxide semiconductor layer 544 and the drain region 544D (that is, the conductive portion 403b) can be sufficiently reduced, so that the conductive portion 403b can be used as a wiring. The pixel structure of the imaging region 130A described with reference to FIG. 5 and FIG. 6 utilizes the features of such the oxide semiconductor layer 544.

In the present embodiment, a light-shielding layer may be arranged between the substrate 500 and the oxide semiconductor layer 544. Arranging the light-shielding layer in a region overlapping the channel region 544CH makes it possible to suppress the characteristic variation of the semiconductor device 10 caused by light irradiation to the channel region 544CH.

In the present embodiment, although a top-gate transistor in which the gate electrode 564 is arranged on the oxide semiconductor layer 544 is exemplified as the semiconductor device 10, the present invention is not limited to this configuration. For example, the semiconductor device 10 may be a bottom-gate transistor in which the gate electrode 564 is arranged below the oxide semiconductor layer 544, or a dual-gate transistor in which the gate electrode 564 is arranged both above and below the oxide semiconductor layer 544.

[Manufacturing Method of Semiconductor Device 10]

Figure 14:
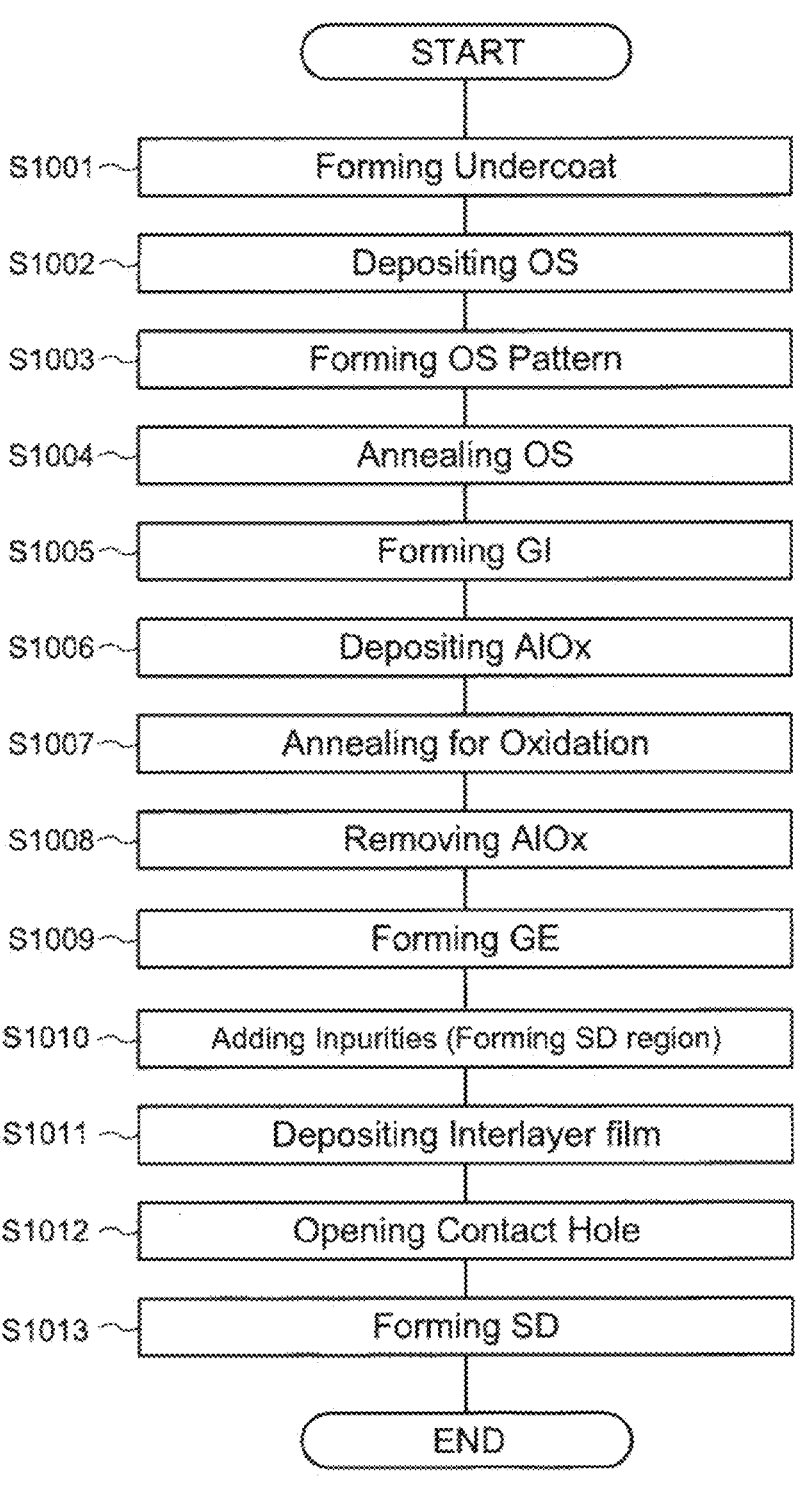
FIG. 14 is a sequence diagram showing a manufacturing method of a semiconductor device according to an embodiment of the present invention.

A manufacturing method of the semiconductor device 10 according to an embodiment of the present invention will be described with reference to FIG. 14 to FIG. 23. FIG. 14 is a sequence diagram showing a manufacturing method of the semiconductor device 10 according to an embodiment of the present invention. FIG. 15 to FIG. 23 are cross-sectional views showing a manufacturing method of the semiconductor device 10 according to an embodiment of the present invention.

Figure 15:
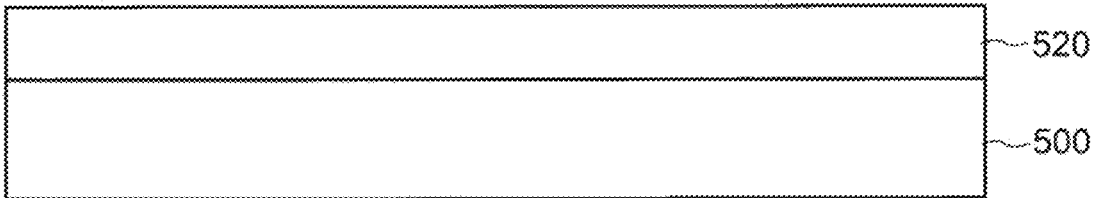
FIG. 15 is a cross-sectional view showing a manufacturing method of a semiconductor device according to an embodiment of the present invention.

First, as shown in FIG. 14 and FIG. 15, the base film 520 is formed on the substrate 500 (step S1001).

A rigid substrate having light transmittance such as a glass substrate, a quartz substrate, a sapphire substrate, or the like is used as the substrate 500. In the case where the substrate 500 needs to be flexible, a substrate containing resin such as a polyimide substrate, an acryl substrate, a siloxane substrate, or a fluororesin substrate is used as the substrate 500. In the case where a substrate containing resin is used as the substrate 500, an impurity element may be introduced into the resin in order to improve the heat resistance of the substrate 500.

The base film 520 is formed by a CVD (Chemical Vapor Deposition) method or a sputtering method. A typical insulating material is used as the base film 520. For example, inorganic insulating material such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), and aluminum nitride ($AlN_x$) are used as the base film 520.

The $SiO_xN_y$ and $AlO_xN_y$ described above are silicon compound and aluminum compound containing a smaller ratio of nitrogen (N) than oxygen (O) (x>y). The $SiN_xO_y$ and $AlN_xO_y$ are silicon compound and aluminum compound containing a smaller ratio of oxygen than nitrogen (x>y).

The base film 520 is formed with a single-layer structure or a stacked structure. In the case where the base film 520 is formed with a stacked structure, it is preferable that nitrogen-containing insulating material and oxygen-containing insulating material are formed in this order from the substrate 500. For example, using nitrogen-containing insulating material makes it possible to block impurities that diffuse from the substrate 500 side toward the oxide semiconductor layer 544. In addition, using oxygen-containing insulating material makes it possible to release oxygen by heat treatment. For example, the temperature of the heat treatment in which the oxygen-containing insulating material releases oxygen is 600° C. or less, 500° C. or less, 450° C. or less, or 400° C. or less. That is, for example, the oxygen-containing insulating material releases oxygen at the heat treatment temperature performed in the manufacturing process of the semiconductor device 10 in the case where a glass substrate is used as the substrate 500. In the present embodiment, for example, silicon nitride is used as the nitrogen-containing insulating material. For example, silicon oxide is used as the oxygen-containing insulating material.

Figure 16:
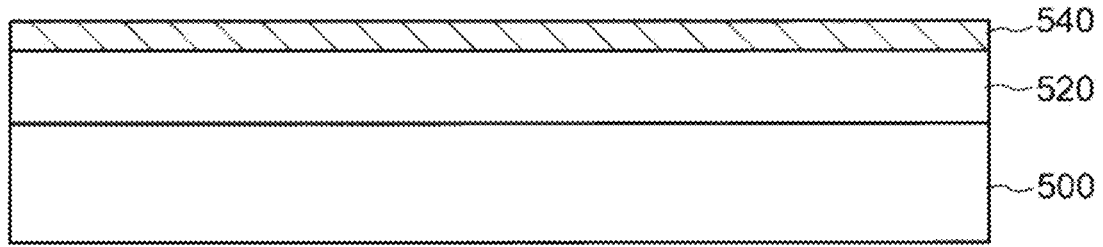
FIG. 16 is a cross-sectional view showing a manufacturing method of a semiconductor device according to an embodiment of the present invention.

Next, as shown in FIG. 14 and FIG. 16, an oxide semiconductor layer 540 is formed on the base film 520 (step S1002). This process may be referred to as forming the oxide semiconductor layer 540 on the substrate 500.

The oxide semiconductor layer 540 is deposited by a sputtering method or an atomic layer deposition method (ALD: Atomic Layer Deposition). For example, a thickness of the oxide semiconductor layer 540 is 10 nm or more and 100 nm or less, 15 nm or more and 70 nm or less, or 20 nm or more and 40 nm or less.

A metal oxide having semiconductor properties can be used as the oxide semiconductor layer 540. For example, an oxide semiconductor containing two or more metals including indium (In) is used as the oxide semiconductor layer

540. In addition, the ratio of indium in the two or more metals is 50% or more. Gallium (Ga), zinc (Zn), aluminum (Al), hafnium (Hf), yttrium (Y), zirconia (Zr), or lanthanoids are used as the oxide semiconductor layer 540 in addition to indium. Elements other than those described above may be used as the oxide semiconductor layer 540. In the present embodiment, a metal oxide (IGO-based oxide semiconductor) containing indium and gallium (Ga) is used as the oxide semiconductor layer 540.

In the case where the oxide semiconductor layer 540 is crystallized by OS annealing (step S1004) described later, the oxide semiconductor layer 540 after deposition and before OS annealing is preferably amorphous (a state in which there are few crystalline components in the oxide semiconductor). In other words, in a deposition method of the oxide semiconductor layer 540, it is preferred to have a condition such that the oxide semiconductor layer 540 immediately after deposition does not crystallize as much as possible. For example, in the case where the oxide semiconductor layer 540 is deposited by a sputtering method, the oxide semiconductor layer 540 is deposited while controlling the temperature of an object to be deposited (the substrate 500 and structures formed thereon).

In the case where deposition is performed on the object to be deposited by the sputtering method, the ions generated in the plasma and atoms recoiled by a sputtering target collide with the object to be deposited, so that the temperature of the object to be deposited increases with the deposition process. When the temperature of the object to be deposited during the deposition process increases, microcrystals are contained in the oxide semiconductor layer 540 in a state immediately after deposition, and crystallization by the subsequent OS annealing is inhibited. In order to control the temperature of the object to be deposited as described above, for example, deposition can be performed while cooling the object to be deposited. For example, the object to be deposited can be cooled from the surface opposite to the deposition surface so that the temperature of the deposition surface of the object to be deposited (hereinafter, referred to as "deposition temperature") is 100° C. or less, 70° C. or less, 50° C. or less, or 30° C. or less. As described above, forming the oxide semiconductor layer 540 while the object to be deposited is cooled makes it possible to deposit the oxide semiconductor layer 540 with few crystalline components in the state immediately after deposition.

Figure 17:
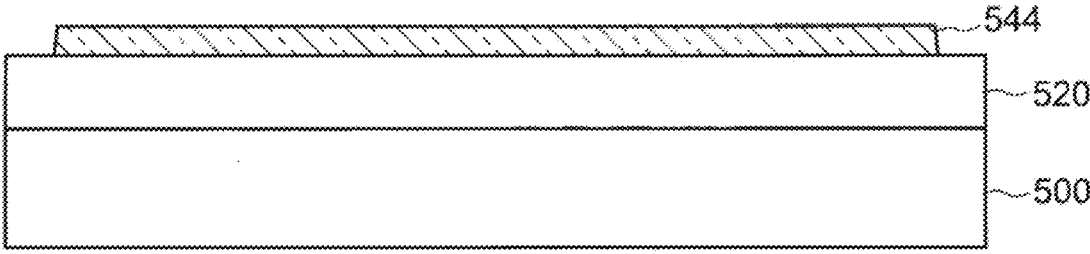
FIG. 17 is a cross-sectional view showing a manufacturing method of a semiconductor device according to an embodiment of the present invention.

Next, as shown in FIG. 14 and FIG. 17, a pattern of the oxide semiconductor layer 540 is formed by photolithography (step S1003). Although not shown, a resist mask is formed on the oxide semiconductor layer 540, and the oxide semiconductor layer 540 is etched using the resist mask. In the case where the oxide semiconductor layer 540 is etched, either wet etching or dry etching may be used. In the case of wet etching, etching can be performed using an acidic etchant. For example, oxalic acid or hydrofluoric acid can be used as the etchant.

The oxide semiconductor layer 540 is preferably patterned before OS annealing performed in step S1004. If the oxide semiconductor layer 540 is crystallized by OS annealing, it tends to be difficult to etch. In addition, even if the oxide semiconductor layer 540 is damaged by etching, the damage can be repaired by OS annealing.

After pattern formation of the oxide semiconductor layer 540, heat treatment (OS annealing) is performed on the oxide semiconductor layer 540 (step S1004). In OS annealing, the oxide semiconductor layer 540 is held at a predetermined reached temperature for a predetermined time. The predetermined reached temperature is 300° C. or more and 500° C. or less, preferably 350° C. or more and 450° C. or less. In addition, the holding time at the reached temperature is 15 minutes or more and 120 minutes or less, preferably 30 minutes or more and 60 minutes or less. Performing OS annealing crystallizes the oxide semiconductor layer 540 and the oxide semiconductor layer 544 having a polycrystalline structure is formed.

Figure 18:
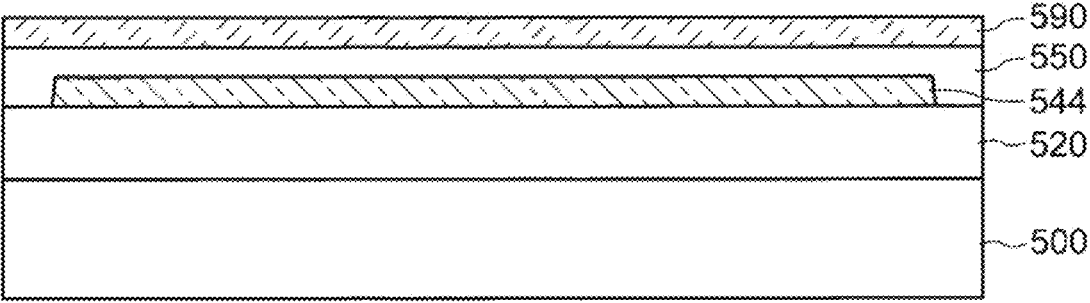
FIG. 18 is a cross-sectional view showing a manufacturing method of a semiconductor device according to an embodiment of the present invention.

Next, as shown in FIG. 14 and FIG. 18, the gate insulating layer 550 is deposited on the oxide semiconductor layer 544 (step S1005).

The deposition method and insulating materials of the gate insulating layer 550 may be referred to the explanation of the base film 520. In the present embodiment, for example, the thickness of the gate insulating layer 550 is 50 nm or more and 150 nm or less, but is not limited to this example.

Oxygen-containing insulating material is preferably used as the gate insulating layer 550. In addition, it is preferable to use an insulating layer with few defects as the gate insulating layer 550. For example, in the case where the composition ratio of oxygen in the gate insulating layer 550 is compared with the composition ratio of oxygen in an insulating layer having a composition similar to that of the gate insulating layer 550 (hereinafter referred to as "another insulating layer"), the composition ratio of oxygen in the gate insulating layer 550 is closer to the stoichiometric ratio with respect to the insulating layer than the composition ratio of oxygen in the other insulating layer. For example, in the case where silicon oxide ($SiO_x$) is used for each of the gate insulating layer 550 and the insulating layer 580, the composition ratio of oxygen in silicon oxide used as the gate insulating layer 550 is close to the stoichiometric ratio of silicon oxide compared to the composition ratio of oxygen in silicon oxide used as the insulating layer 580. For example, a layer where no defects are observed when evaluated by an electron-spin resonance method (ESR) may be used as the gate insulating layer 550.

The gate insulating layer 550 may be deposited at a deposition temperature of 350° C. or higher in order to form a less defective insulating layer as the gate insulating layer 550. In addition, an oxygen-implanting process may be performed on a portion of the gate insulating layer 550 after the gate insulating layer 550 is deposited. In the present embodiment, a silicon oxide layer is formed at a deposition temperature of 350° C. or higher in order to form an insulating layer with few defects as the gate insulating layer 550.

Next, as shown in FIG. 14 and FIG. 18, a metal oxide layer 590 containing aluminum as a main component is formed on the gate insulating layer 550 (step S1006).

The metal oxide layer 590 is deposited by a sputtering method. Oxygen is implanted into the gate insulating layer 550 by the deposition of the metal oxide layer 590. For example, an inorganic insulating layer such as aluminum oxide ($AlO_x$), aluminum oxynitride ($AlO_xN_y$), aluminum nitride oxide ($AlN_xO_y$), and aluminum nitride ($AlN_x$) are used as the metal oxide layer containing aluminum as a main component. The "metal oxide layer containing aluminum as a main component" means that the ratio of aluminum contained in the metal oxide layer 590 is 1% or more of the entire metal oxide layer 590. The ratio of aluminum contained in the metal oxide layer 590 may be 5% or more and 70% or less, 10% or more and 60% or less, or 30% or more and 50% or less of the entire metal oxide layer 590. The above ratios may be mass ratios or weight ratios.

For example, the thickness of the metal oxide layer 590 is 5 nm or more and 100 nm or less, 5 nm or more and 50 nm or less, 5 nm or more and 30 nm or less, or 7 nm or more and 15 nm or less. In the present embodiment, aluminum oxide is used as the metal oxide layer 590. Aluminum oxide has a high barrier property against gas. In the present embodiment, the aluminum oxide used as the metal oxide layer 590 suppresses the oxygen implanted into the gate insulating layer 550 from diffusing outward at the time of deposition of the metal oxide layer 590.

For example, in the case where the metal oxide layer 590 is formed by a sputtering method, a process gas used in sputtering remains in the film of the metal oxide layer 590. For example, in the case where Ar is used as the process gas for sputtering, Ar may remain in the film of the metal oxide layer 590. The remaining Ar can be detected by SIMS (Secondary Ion Mass Spectrometry) analyses on the metal oxide layer 590.

In a state where the gate insulating layer 550 is formed on the oxide semiconductor layer 544 and the metal oxide layer 590 is formed on the gate insulating layer 550, heat treatment (oxidation annealing) for supplying oxygen to the oxide semiconductor layer 544 is performed (step S1007).

In the process from the deposition of the oxide semiconductor layer 544 to the deposition of the gate insulating layer 550 on the oxide semiconductor layer 544, a large number of oxygen deficiencies occur on the upper surface and the side surface of the oxide semiconductor layer 544. Oxygen emitted from the base film 520 is supplied to the upper surface and the side surface of the oxide semiconductor layer 544 by the oxidation annealing, and oxygen deficiency inside the oxide semiconductor layer 544 is repaired.

In the above-described oxidation annealing, the oxygen implanted into the gate insulating layer 550 is blocked by the metal oxide layer 590 and suppressed from being released into the atmosphere. Therefore, oxygen is efficiently supplied to the oxide semiconductor layer 544 by the oxidation annealing performed in step S1007, and oxygen deficiencies inside the oxide semiconductor layer 544 are repaired.

Figure 19:
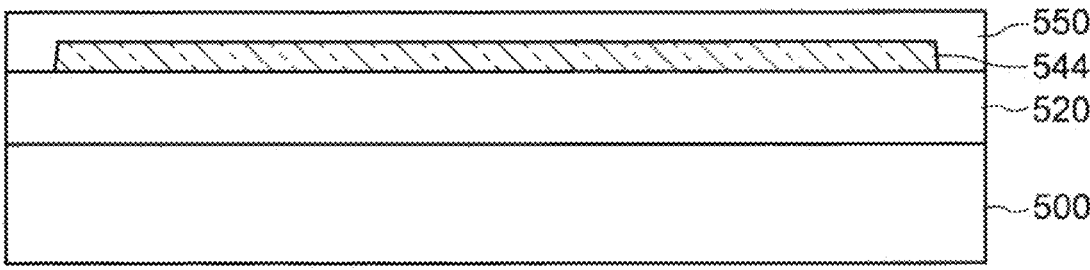
FIG. 19 is a cross-sectional view showing a manufacturing method of a semiconductor device according to an embodiment of the present invention.

Next, as shown in FIG. 14 and FIG. 19, the metal oxide layer 590 is etched (removed) after the oxidation annealing (step S1008). Etching of the metal oxide layer 590 may be performed by either wet etching or dry etching. For example, dilute hydrofluoric acid (DHF) is used as the etchant for wet etching. The metal oxide layer 590 formed on the entire surface of the gate insulating layer 550 is removed by the etching. In other words, the metal oxide layer 590 is removed without using a mask. In other words, the etching performed in step S1008 removes all the metal oxide layer 590 in a region overlapping the oxide semiconductor layer 544 formed in one pattern at least in a plan view.

Figure 20:
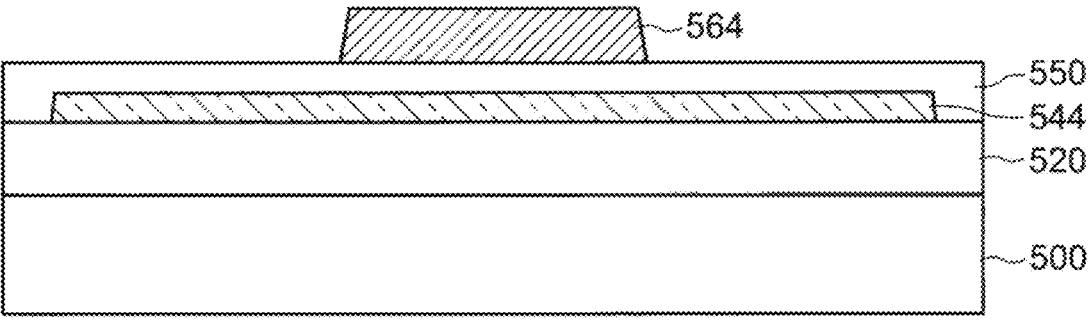
FIG. 20 is a cross-sectional view showing a manufacturing method of a semiconductor device according to an embodiment of the present invention.

Next, as shown in FIG. 14 and FIG. 20, the gate electrode 564 is formed on the gate insulating layer 550 (step S1009). The gate electrode 564 is formed by patterning a metal layer formed by a sputtering method or an atomic layer deposition method. As described above, the gate electrode 564 is formed to be in contact with the gate insulating layer 550 exposed by removing the metal oxide layer 590.

A typical metal material is used as the material of the gate electrode 564. For example, examples of the metal material include aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and alloys or compounds thereof. In the gate electrode 564, the above-described material may be used in a single-layer structure or may be used in a stacked structure.

Figure 21:
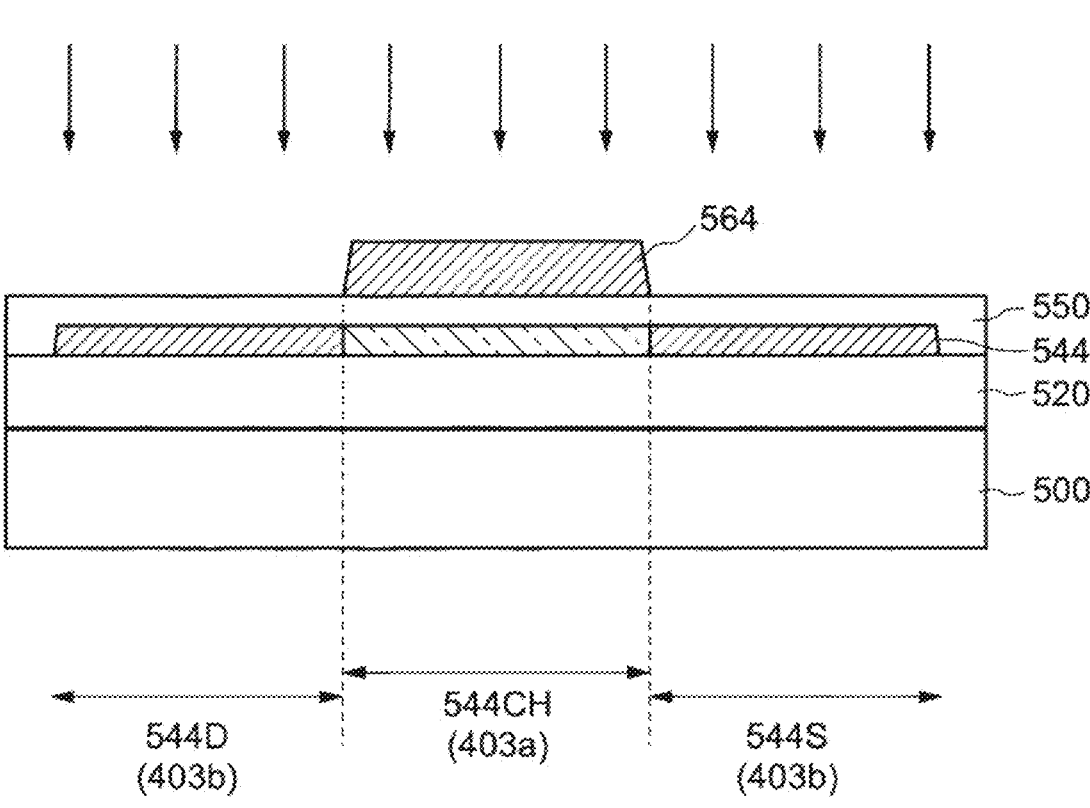
FIG. 21 is a cross-sectional view showing a manufacturing method of a semiconductor device according to an embodiment of the present invention.

Next, as shown in FIG. 14 and FIG. 21, the source region 544S and the drain region 544D of the oxide semiconductor layer 544 are formed in a state where the gate electrode 564 formed (step S1010). Specifically, an impurity element is implanted into the oxide semiconductor layer 544 via the gate insulating layer 550 using the gate electrode 564 as a mask by an ion implantation method or an ion doping method. In step S1010, for example, an impurity element such as argon (Ar), phosphorus (P), or boron (B) is implanted into a part of the oxide semiconductor layer 544 not covered with the gate electrode 564.

Oxygen vacancies are formed in the region of the oxide semiconductor layer 544 where the impurity element is implanted, so that the resistance is reduced to the extent that it can function as a conductive layer. That is, since the impurity element is implanted into the oxide semiconductor layer 544 in step S1010, the conductive portion 403b (the source region 544S and the drain region 544D) is formed in the region not covered with the gate electrode 564. On the other hand, the channel portion 403a (the channel region 544CH) is formed in the region of the oxide semiconductor layer 544 covered with the gate electrode 564. Since the gate electrode 564 functions as a mask, no impurity element is implanted into the channel portion 403a.

In addition, in the present embodiment, since the impurity element is implanted into the oxide semiconductor layer 544 via the gate insulating layer 550, not only the source region 544S and the drain region 544D but also the gate insulating layer 550 contains an impurity element such as argon (Ar), phosphorus (P), or boron (B).

Figure 22:
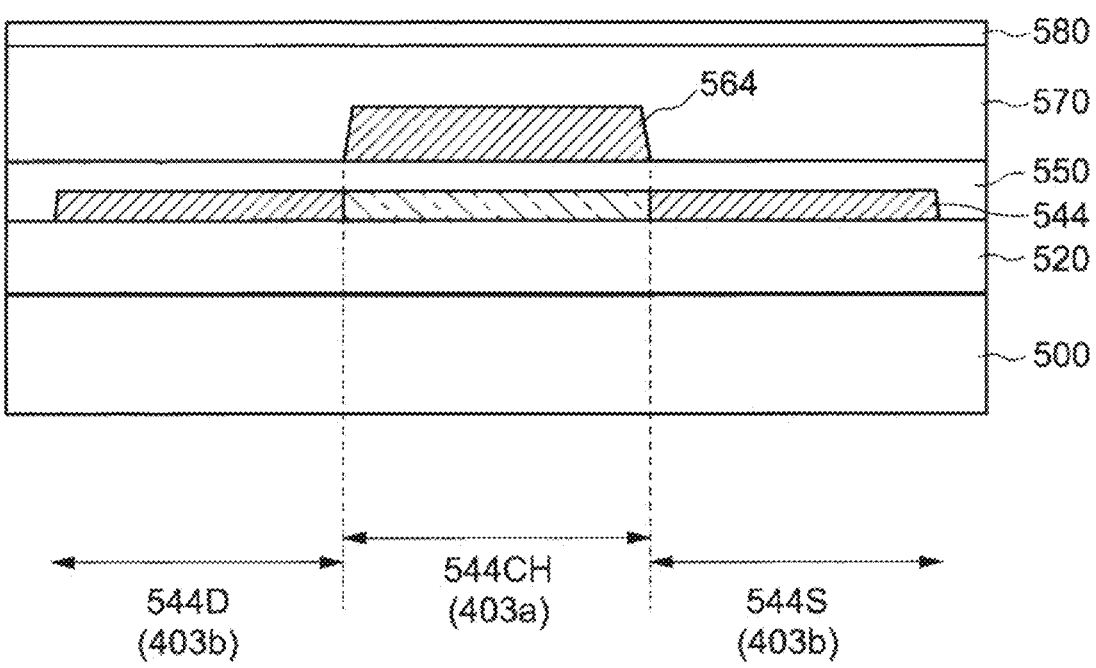
FIG. 22 is a cross-sectional view showing a manufacturing method of a semiconductor device according to an embodiment of the present invention.

Next, as shown in FIG. 14 and FIG. 22, the insulating layers 570 and 580 are formed as interlayer films on the gate insulating layer 550 and the gate electrode 564 (step S1011).

The deposition method and insulating materials of the insulating layers 570 and 580 may be refer to the explanation of the base film 520. The thickness of the insulating layer 570 is 50 nm or more and 500 nm or less. The thickness of the insulating layer 580 is 50 nm or more and 500 nm or less. In the present embodiment, for example, a silicon nitride layer is formed as the insulating layer 570, and a silicon oxide layer is formed as the insulating layer 580.

Figure 23:
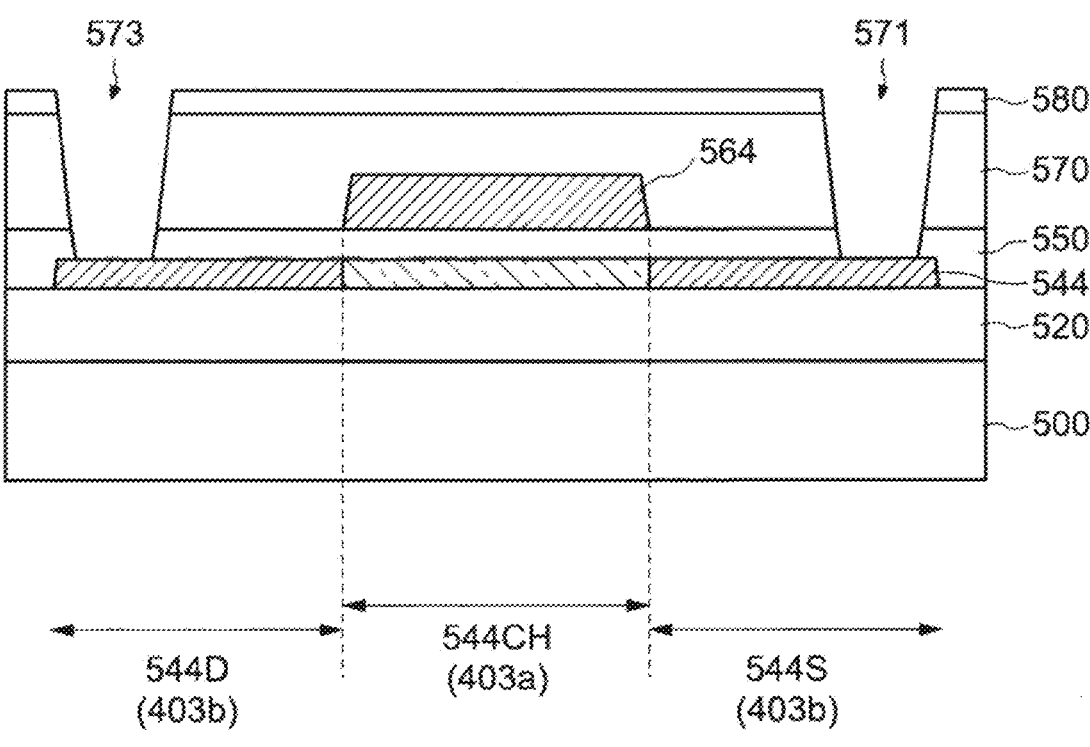
FIG. 23 is a cross-sectional view showing a manufacturing method of a semiconductor device according to an embodiment of the present invention.

Next, as shown in FIG. 14 and FIG. 23, the contact holes 571 and 573 are formed in the gate insulating layer 550 and the insulating layers 570 and 580 (step S1012). The source region 544S is exposed by the contact hole 571, and the drain region 544D is exposed by the contact hole 573. The source region 544S and the drain region 544D are exposed by the contact holes 571 and 573, and then the source electrode 601 and the drain electrode 603 shown in FIG. 10 are formed (step S1013). Through the above processes, the semiconductor device 10 shown in FIG. 10 is completed.

For example, the source electrode 601 and the drain electrode 603 are formed by a sputtering method. The source electrode 601 and the drain electrode 603 can be formed using a typical metal material. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and alloys or compounds thereof can be used as the metal material. The source electrode 601 and the drain electrode 603 may have a single-layer structure or a stacked structure.

In the semiconductor device 10 manufactured by the above-described manufacturing method, electric characteristics (specifically, field-effect mobility) having a mobility of 30 cm²/Vs or more, 35 cm²/Vs or more, or 40 cm²/Vs or more can be obtained in a range where a channel length L of the channel region 544CH is 2 μm or more and 4 μm or less and a channel width of the channel region 544CH is 2 μm or more and 25 μm or less. The field-effect mobility in the present embodiment is the field-effect mobility in a saturated region of the semiconductor device 10, and it means the maximum value of the field-effect mobility in a region where a potential difference (Vd) between the source electrode and the drain electrode is larger than a value (Vg–Vt) obtained by subtracting a threshold voltage (Vth) of the semiconductor device 10 from a voltage (Vg) supplied to the gate electrode.

The semiconductor device 10 of the present embodiment can be used as a wiring because the resistance of the source region 544S and the drain region 544D is sufficiently low. Since the oxide semiconductor has light transmittance, if the oxide semiconductor can be used as wiring material as in the present embodiment, it is very advantageous to improve the transmittance of the display panel (in the present embodiment, the organic EL panel 200).

Second Embodiment

In the present embodiment, a semiconductor device 10a having a configuration that is different from the configuration of the semiconductor device 10 described in the first embodiment will be described.

[Configuration of Semiconductor Device 10a]

Although a configuration of the semiconductor device 10a is similar to that of the semiconductor device 10 of the first embodiment, it is different from that of the semiconductor device 10 of the first embodiment in that a metal oxide layer 530 is arranged between the base film 520 and the oxide semiconductor layer 544. In the following description, the same configuration as in the first embodiment will be omitted, and differences from the first embodiment will be mainly described.

Figure 24:
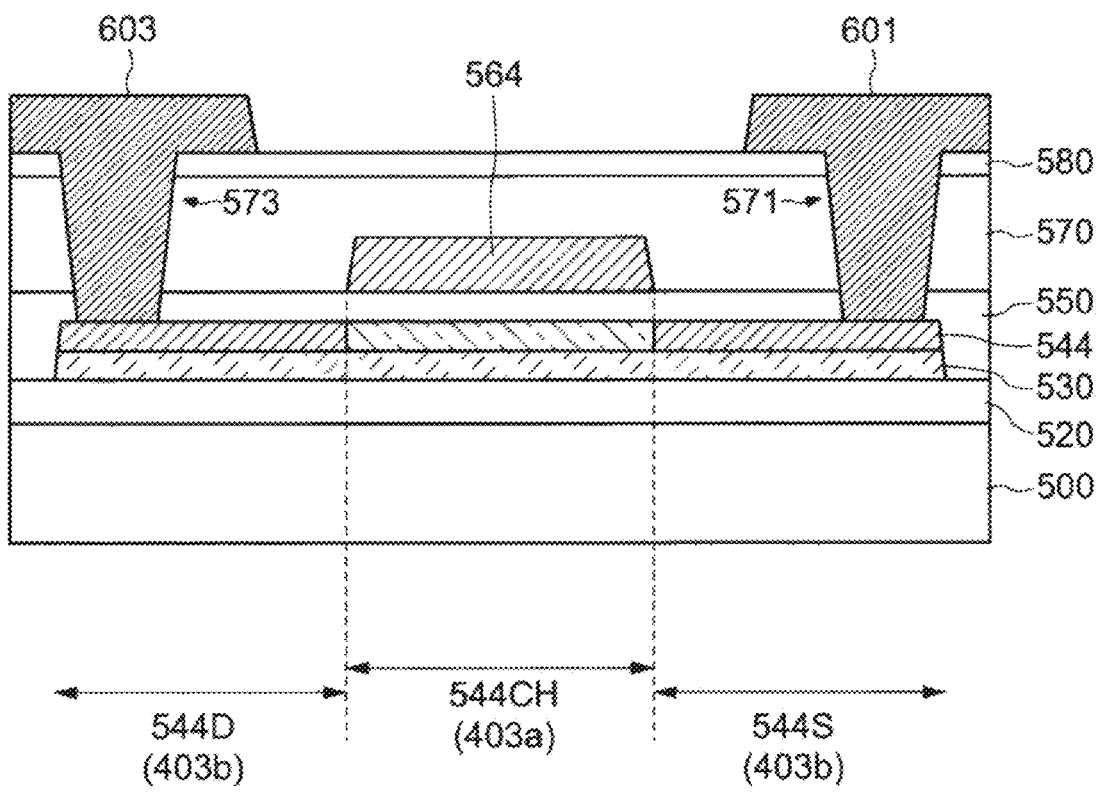
FIG. 24 is a cross-sectional view showing an outline of a semiconductor device according to an embodiment of the present invention.

FIG. 24 is a cross-sectional view showing an outline of the semiconductor device 10a according to an embodiment of the present invention. As shown in FIG. 24, the semiconductor device 10a includes the base film 520, the metal oxide layer 530, the oxide semiconductor layer 544, the gate insulating layer 550, the gate electrode 564, the insulating layer 570, the insulating layer 580, the source electrode 601, and the drain electrode 603.

The metal oxide layer 530 is arranged on the base film 520. The metal oxide layer 530 is in contact with the base film 520. The oxide semiconductor layer 544 is arranged on the metal oxide layer 530. The oxide semiconductor layer 544 is in contact with the metal oxide layer 530. A surface of the main surface of the oxide semiconductor layer 544 that is in contact with the metal oxide layer 530 is referred to as a lower surface. An end portion of the metal oxide layer 530 and an end portion of the oxide semiconductor layer 544 are substantially the same.

The metal oxide layer 530 is a layer containing metal oxide containing aluminum as a main component in the same manner as the metal oxide layer 590 (see FIG. 18), and has a function as a gas barrier film for shielding a gas such as oxygen or hydrogen. Although material similar to that of the metal oxide layer 590 can be used as the metal oxide layer 530, a different material may be used.

Although a planar shape of the semiconductor device 10a is the same as that in FIG. 11, a planar pattern of the metal oxide layer 530 in a plan view is substantially the same as a planar pattern of the oxide semiconductor layer 544. Referring to FIG. 24, the lower surface of the oxide semiconductor layer 544 is covered with the metal oxide layer 530. In particular, in the present embodiment, all of the lower surface of the oxide semiconductor layer 544 is covered with the metal oxide layer 530.

Since the ratio of indium in the oxide semiconductor layer 544 is 50% or more, the semiconductor device 10*a* with high mobility can be realized. On the other hand, in such an oxide semiconductor layer 544, oxygen contained in the oxide semiconductor layer 544 is easily reduced, and oxygen deficiencies are easily formed in the oxide semiconductor layer 544.

In the semiconductor device 10*a*, in the heat treatment process of the manufacturing process, oxygen deficiencies may occur in the oxide semiconductor layer 544 when hydrogen is released from the layer arranged closer to the substrate 500 than the oxide semiconductor layer 544 (for example, the base film 520) and the hydrogen reaches the oxide semiconductor layer 544. The occurrence of oxygen deficiencies is remarkable as the pattern size of the oxide semiconductor layer 544 increases. In order to suppress the occurrence of such oxygen deficiencies, it is required to suppress hydrogen from reaching the lower surface of the oxide semiconductor layer 544.

In addition, the upper surface of the oxide semiconductor layer 544 is affected by a process (for example, a patterning process or an etching process) after the oxide semiconductor layer 544 is formed. On the other hand, the lower surface of the oxide semiconductor layer 544 (the surface of the oxide semiconductor layer 544 on the substrate 500 side) is not affected as described above.

As a result, the oxygen deficiencies formed on the upper surface of the oxide semiconductor layer 544 are larger than the oxygen deficiencies formed on the lower surface of the oxide semiconductor layer 544. That is, oxygen deficiencies in the oxide semiconductor layer 544 are not present in a uniform distribution in the thickness direction of the oxide semiconductor layer 544, but in a non-uniform distribution in the thickness direction of the oxide semiconductor layer 544. Specifically, oxygen deficiencies inside the oxide semiconductor layer 544 are fewer toward the lower surface side of the oxide semiconductor layer 544 and more toward the upper surface side of the oxide semiconductor layer 544.

In the case where an oxygen supply process is uniformly performed on the oxide semiconductor layer 544 in which oxygen deficiencies are distributed as described above, when oxygen is supplied in an amount required to repair the oxygen deficiencies formed on the upper surface side of the oxide semiconductor layer 544, oxygen is excessively supplied to the lower surface side of the oxide semiconductor layer 544. As a result, a defect level different from the oxygen deficiency is formed on the lower surface side due to excessive oxygen, and phenomena such as a characteristic variation in a reliability test or a decrease in field-effect mobility occur. Therefore, in order to suppress such phenomena, oxygen needs to be supplied to the upper surface side of the oxide semiconductor layer 544 while suppressing oxygen supply to the lower surface side of the oxide semiconductor layer 544.

In the conventional configuration and manufacturing method, even if the initial characteristics of the semiconductor device are improved by the oxygen supply process to the oxide semiconductor layer, the characteristic variation due to the reliability test may occur. That is, the conventional configuration and manufacturing method have a trade-off relationship between the initial characteristics and the reliability test. However, with the configuration and manufacturing methods according to the present embodiment, it is possible to obtain good initial characteristics and a reliability test of the semiconductor device 10*a*.

[Manufacturing Method of Semiconductor Device 10*a*]

Figure 25:
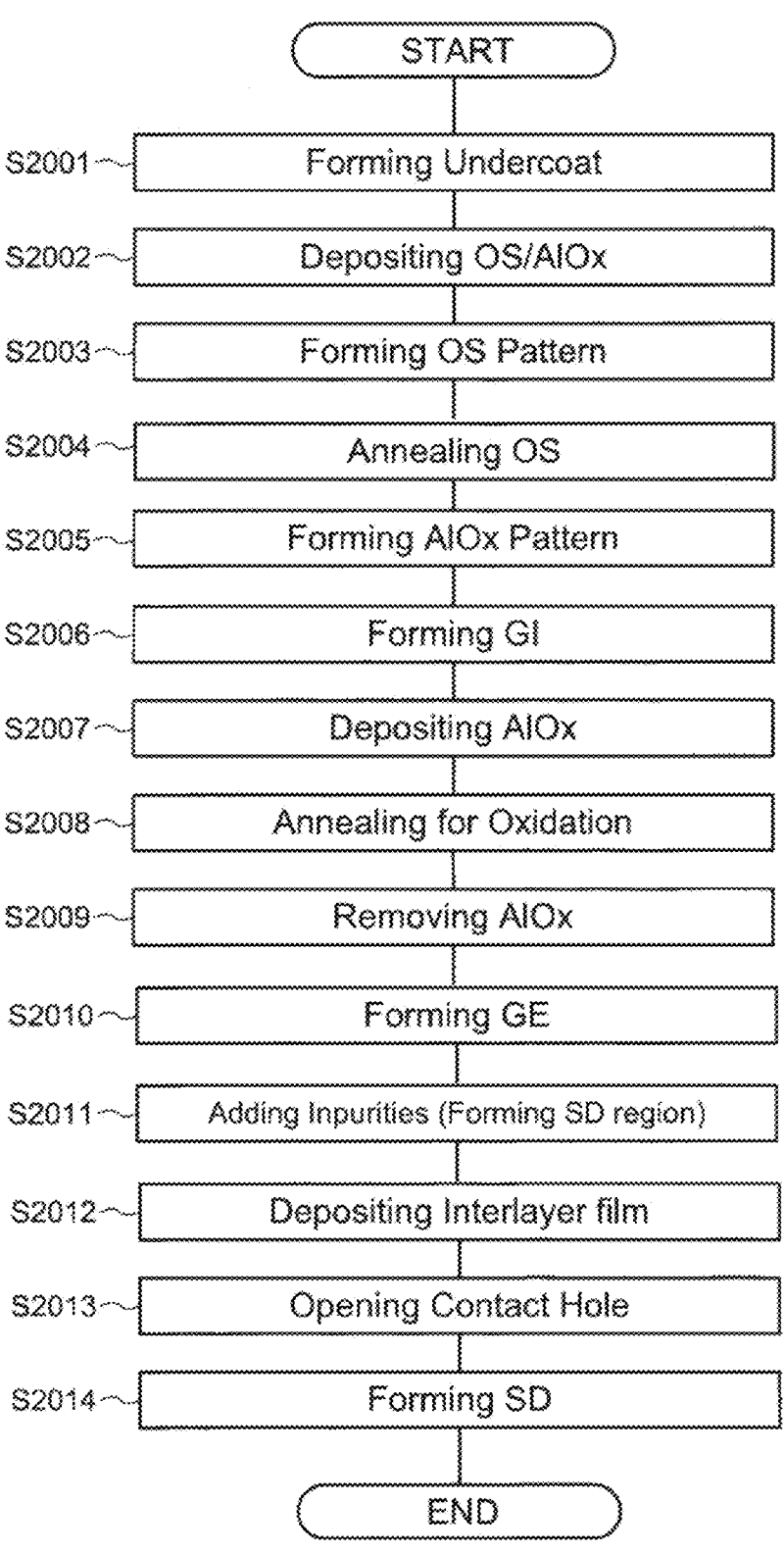
FIG. 25 is a sequence diagram showing a manufacturing method of a semiconductor device according to an embodiment of the present invention.
Figure 26:
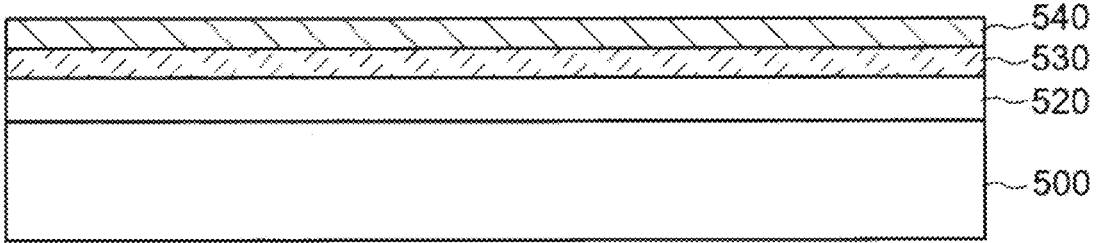
FIG. 26 is a cross-sectional view showing a manufacturing method of a semiconductor device according to an embodiment of the present invention.
Figure 27:
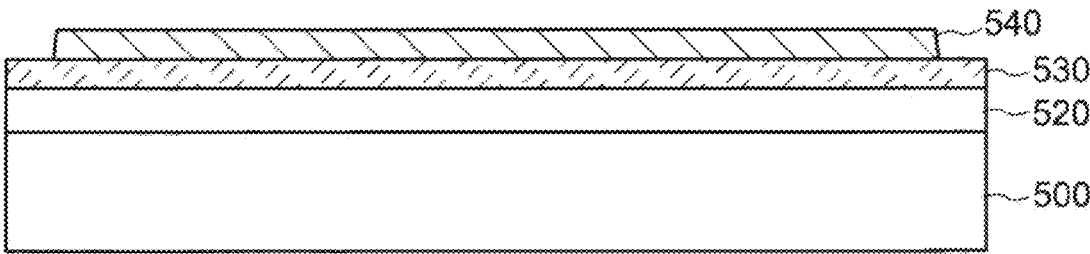
FIG. 27 is a cross-sectional view showing a manufacturing method of a semiconductor device according to an embodiment of the present invention.
Figure 28:
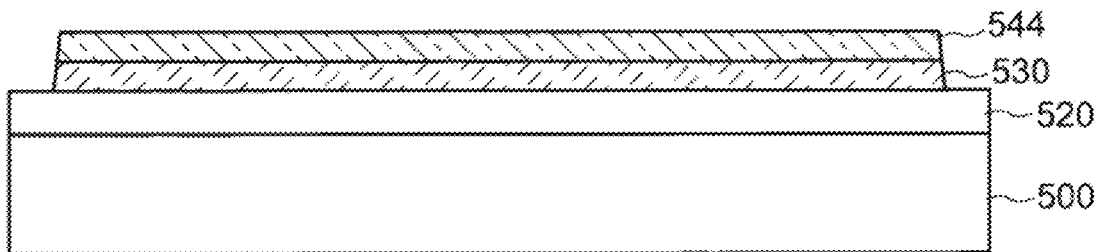
FIG. 28 is a cross-sectional view showing a manufacturing method of a semiconductor device according to an embodiment of the present invention.

The semiconductor device 10*a* according to an embodiment of the present invention will be described with reference to FIG. 25 to FIG. 28. FIG. 25 is a sequence diagram showing a manufacturing method of the semiconductor device 10*a* according to an embodiment of the present invention. FIG. 26 to FIG. 28 are cross-sectional views showing a manufacturing method of the semiconductor device 10*a* according to an embodiment of the present invention.

As shown in FIG. 25, the base film 520 is formed on the substrate 500 (step S2001). Step S2001 may be refer to the explanation of step S1001 shown in FIG. 14 and FIG. 15. In the present embodiment, silicon nitride and silicon oxide are used as the base film 520. Silicon oxide is preferred for reducing oxygen deficiencies in the oxide semiconductor layer 544 because it releases oxygen by heat treatment.

As shown in FIG. 25 and FIG. 26, the metal oxide layer 530 and the oxide semiconductor layer 540 are formed on the base film 520 (step S2002). The metal oxide layer 530 and the oxide semiconductor layer 540 are deposited by a sputtering method or an atomic layer deposition method (ALD: Atomic Layer Deposition).

The material of the metal oxide layer 530 may be referred to the description of the material of the metal oxide layer 590 shown in FIG. 18. For example, the thickness of the metal oxide layer 530 is 1 nm or more and 100 nm or less, 1 nm or more and 50 nm or less, 1 nm or more and 30 nm or less, or 1 nm or more and 10 nm or less. In the present embodiment, aluminum oxide is used as the metal oxide layer 530. Aluminum oxide has a high barrier property against gas. In the present embodiment, the aluminum oxide used as the metal oxide layer 530 blocks hydrogen and oxygen released from the base film 520 and suppresses the released hydrogen and oxygen from reaching the oxide semiconductor layer 540.

For example, the thickness of the oxide semiconductor layer 540 is 10 nm or more and 100 nm or less, 15 nm or more and 70 nm or less, or 20 nm or more and 40 nm or less. In the present embodiment, an oxide containing indium (In) and gallium (Ga) is used as the oxide semiconductor layer 540. The oxide semiconductor layer 540 before OS annealing performed in step S2004 described later is amorphous.

In the case where the oxide semiconductor layer 540 is crystallized by OS annealing described later, the oxide semiconductor layer 540 after deposition and before OS annealing is preferably amorphous (a state in which there are few crystalline components in the oxide semiconductor). The deposition method in which the oxide semiconductor layer 540 after deposition is amorphous may be referred to the explanation of step S1002 shown in FIG. 14.

Next, as shown in FIG. 25 and FIG. 27, a pattern of the oxide semiconductor layer 540 is formed (step S2003). Although not shown, a resist mask is formed on the oxide semiconductor layer 540, and the oxide semiconductor layer 540 is etched using the resist mask. Etching of the oxide semiconductor layer 540 may be performed by either wet etching or dry etching. The wet etching can be performed using an acidic etchant. For example, oxalic acid or hydrofluoric acid can be used as the acidic etchant.

Next, as shown in FIG. 25, after pattern formation of the oxide semiconductor layer 540, heat treatment (OS annealing) is performed on the oxide semiconductor layer 540 (step S2004). In the present embodiment, the oxide semiconductor layer 540 is crystallized by OS annealing. In addition, the crystallized oxide semiconductor layer is referred to as the oxide semiconductor layer 544.

Next, as shown in FIG. 25 and FIG. 28, a pattern of the metal oxide layer 530 is formed (step S2005). The metal oxide layer 530 is etched using the crystallized oxide semiconductor layer 544 as a mask. Etching of the metal oxide layer 530 may be performed by either wet etching or dry etching. For example, dilute hydrofluoric acid (DHF) is used as the etchant for wet etching. The crystallized oxide semiconductor layer 544 has etching resistance to dilute hydrofluoric acid as compared to the amorphous oxide semiconductor layer 540. Therefore, the metal oxide layer 530 can be etched in a self-aligned manner using the oxide semiconductor layer 544 as a mask. As a result, the photolithography process can be omitted.

Since the process shown in step S2006 to step S2014 shown in FIG. 25 is the same as step S1005 to step S1013 shown in FIG. 14, the following explanation is omitted. The semiconductor device 10a shown in FIG. 24 can be formed through step S2006 to step S2014.

In the semiconductor device 10a manufactured by the above-described manufacturing method, electric characteristics (specifically, field-effect mobility) having a mobility of 50 cm²/Vs or more, 55 cm²/Vs or more, or 60 cm²/Vs or more can be obtained in a range where the channel length L of the channel region 544CH is 2 μm or more and 4 μm or less and the channel width of the channel region 544CH is 2 μm or more and 25 μm or less. The definition of the field-effect mobility in the present embodiment is the same as in the first embodiment.

Third Embodiment

In the present embodiment, a semiconductor device manufactured by a method different from the second embodiment will be described. A structure of the semiconductor device of the present embodiment is the same as that of the semiconductor device 10a described in the second embodiment in appearance. The present embodiment will be described focusing on differences from the second embodiment.

Figure 29:
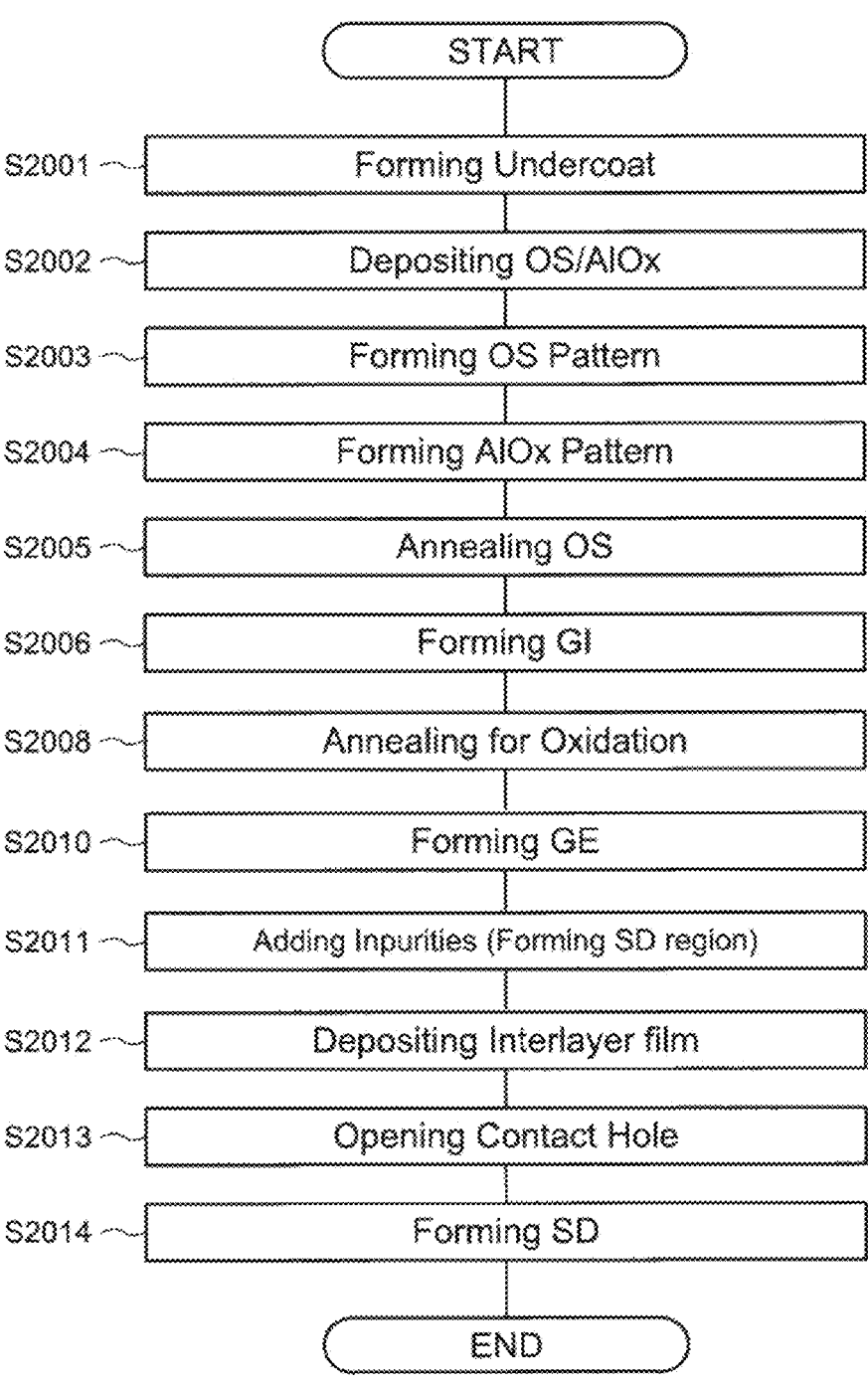
FIG. 29 is a sequence diagram showing a manufacturing method of a semiconductor device according to an embodiment of the present invention.

FIG. 29 is a sequence diagram showing a manufacturing method of a semiconductor device according to an embodiment of the present invention. As shown in FIG. 29, in the present embodiment, two steps of step S2007 and step S2009 shown in FIG. 25 are omitted. That is, in the present embodiment, the gate insulating layer 550 is formed, and then oxidation annealing (step S2008) is performed as it is. Oxygen released from the gate insulating layer 550 is supplied to the oxide semiconductor layer 540 by oxidation annealing, and oxygen deficiencies in the oxide semiconductor layer 540 are repaired. Since the role of the metal oxide layer 530 in this case is the same as in the second embodiment, the description thereof will be omitted.

In the semiconductor device 10a prepared by the manufacturing process of the present embodiment, electric characteristics (specifically, field-effect mobility) having a mobility of 30 cm²/Vs or more, 35 cm²/Vs or more, or 40 cm²/Vs or more can be obtained in a range where the channel length L of the channel region 544CH is 2 μm or more and 4 μm or less and the channel width of the channel region 544CH is 2 μm or more and 25 μm or less. The definition of the field-effect mobility in the present embodiment is the same as in the first embodiment.

Fourth Embodiment

In the present embodiment, a semiconductor device manufactured by a method different from the first embodiment will be described. A structure of the semiconductor device of the present embodiment is the same as that of the semiconductor device 10 described in the first embodiment. The present embodiment will be described focusing on differences from the first embodiment.

Figure 30:
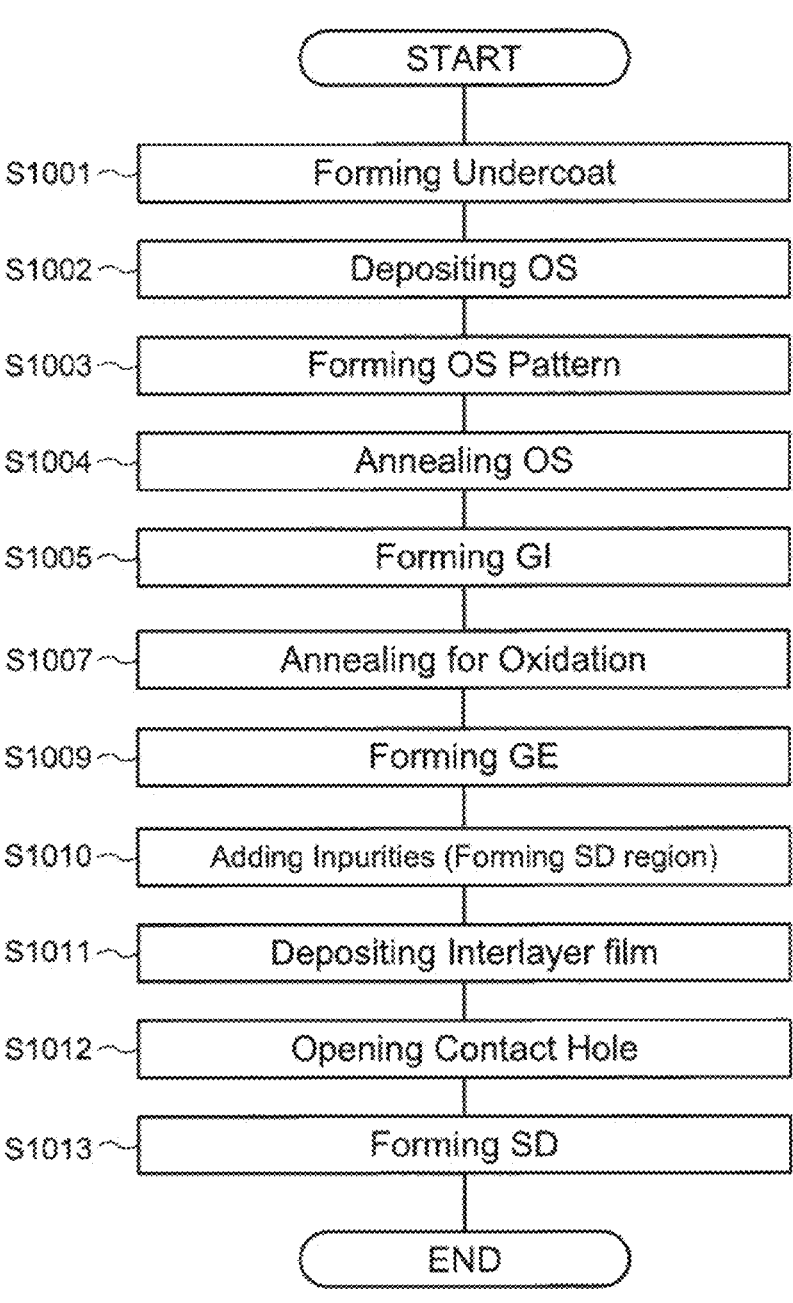
FIG. 30 is a sequence diagram showing a manufacturing method of a semiconductor device according to an embodiment of the present invention.

FIG. 30 is a sequence diagram showing a manufacturing method of a semiconductor device according to an embodiment of the present invention. As shown in FIG. 30, in the present embodiment, two steps of step S1006 and step S1008 shown in FIG. 14 are omitted. That is, in the present embodiment, the gate insulating layer 550 is formed, and then oxidation-annealing (step S1007) is performed as it is. Oxygen released from the gate insulating layer 550 is supplied to the oxide semiconductor layer 544 by oxidation annealing and oxygen deficiencies contained in the oxide semiconductor layer 544 are repaired.

Fifth Embodiment

In the first embodiment, although an example in which the scan signal line 214 in the imaging region 130A is configured by using a metal layer is shown, in the present embodiment, an example in which a transparent conductive layer is used instead of the metal layer is shown. A structure of the display device of the present embodiment is the same as that of the display device 100 described in the first embodiment in appearance. In the present embodiment, configurations different from those of the first embodiment will be described, and the same configurations will be illustrated using the same reference signs, and description thereof will be omitted.

Figure 31:
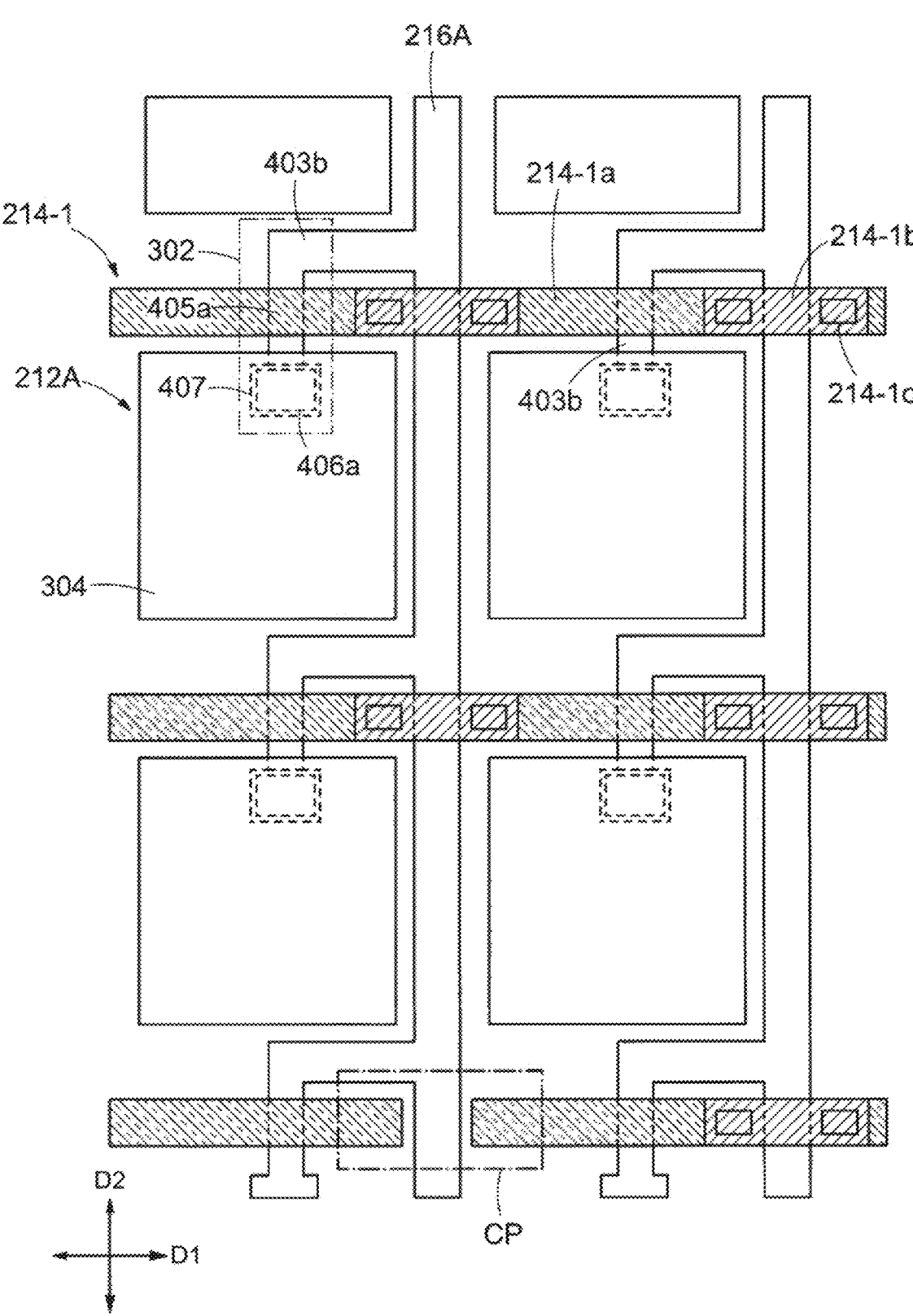
FIG. 31 is a plan view showing a structure of a pixel in an imaging region in a display device according to an embodiment of the present invention.

FIG. 31 is a plan view showing a pixel structure of the pixel 212A in the imaging region 130A in the display device 100 according to an embodiment of the present invention. In the present embodiment, a scan signal line 214-1 (including a gate electrode 405a) in FIG. 31 is formed of a transparent conductive layer. Specifically, in the present embodiment, ITO (Indium Tin Oxide) is used as a material constituting the transparent conductive layer. Another metal oxide having light transmittance may be used as the transparent conductive layer.

In the display device 100 of the present embodiment, in the imaging region 130A, since the scan signal line 214-1 is formed of the transparent conductive layer, the scan signal line 214-1 does not block visible light. Therefore, according to the present embodiment, the transmittance of the display panel can be further improved than that of the imaging region 130A of the first embodiment. In addition, the configuration of the scan signal line 214-1 is the same as that shown in FIG. 5. Specifically, a plurality of wirings 214-1a is connected to each other by a connecting wiring 214-1b arranged across the video signal line 216A and functions as the scan signal line 214-1 as a whole. The connecting wiring 214-1b is electrically connected to each wiring 214-1a via a contact portion 214-1c. The positional relationship between the wiring 214-1a and the video signal line 216A is as shown in the portion surrounded by the frame line CP.

In addition, in the present embodiment, a scan signal line 214-1 in the imaging region 130A is formed of the transparent conductive layer, and a scan signal line in the non-imaging region 130B is formed of the metal layer. That is, in the present embodiment, the transparent conductive layer with a relatively high resistance value is used for a limited region (that is, the imaging region 130A), and the metal layer with a relatively low resistance value is used for the non-imaging region 130B wider than the imaging region 130A. As a result, even if the transparent conductive layer is used for a part of the scan signal line, it is possible to suppress a display defect due to signal delay or the like. However, the present invention is not limited to this example, and the transparent conductive layer may be used not only for the imaging region 130A but also for the scan signal line in the non-imaging region 130B.

In the present embodiment, although an example in which the transparent conductive layer is used for the scan signal line 214-1 is shown, the transparent conductive layer may be used for the anode power line 305 (see FIG. 3). In this case, the transmittance of the display panel can be further improved.

Sixth Embodiment

In the present embodiment, an example in which the imaging region 130A and the non-imaging region 130B have different pixel densities will be described. Specifically, in the present embodiment, an example in which the pixel density in the imaging region 130A is smaller than the pixel density in the non-imaging region 130B is shown. In the present embodiment, configurations different from those of the first embodiment will be described, and the same configurations will be illustrated using the same reference signs, and description thereof will be omitted.

Figure 32:
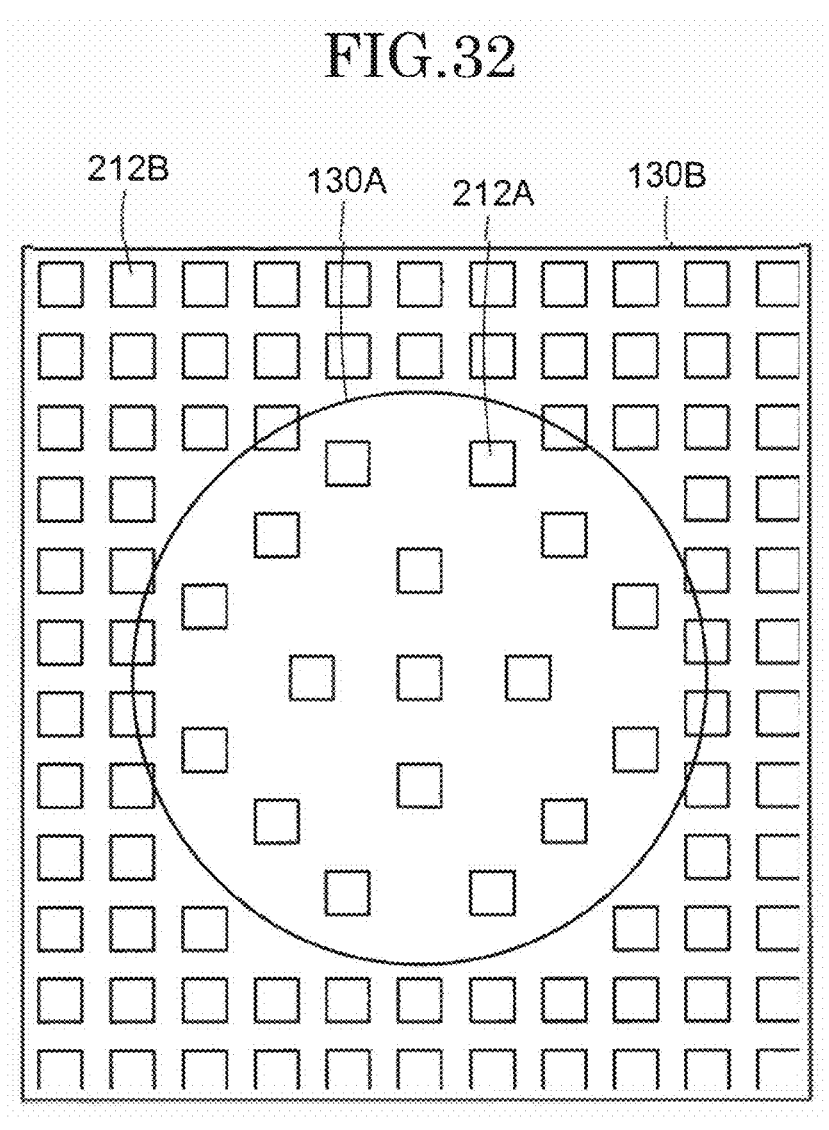
FIG. 32 is a plan view showing a vicinity of an imaging region in a display device according to an embodiment of the present invention.

FIG. 32 is a plan view showing a vicinity of the imaging region 130A in the display device 100 according to an embodiment of the present invention. As shown in FIG. 32, in the present embodiment, the pixel density of the pixel 212A arranged in the imaging region 130A is made smaller than the pixel 212B arranged in the non-imaging region 130B. In this case, the pixel density is the number of pixels included per unit region. That is, in the imaging region 130A, a distance between adjacent pixels is larger than a distance between adjacent pixels in the non-imaging region 130B.

According to the present embodiment, since more gaps can be arranged between the pixels arranged in the imaging region 130A than in the non-imaging region 130B, the transmittance of the display panel (in this case, the organic EL panel 200) can be improved.

Seventh Embodiment

In the present embodiment, an example in which the thickness of the substrate differs between the imaging region 130A and the non-imaging region 130B will be described. Specifically, in the present embodiment, an example in which the thickness of the substrate in the imaging region 130A is thinner than the thickness of the substrate in the non-imaging region 130B is shown. In the present embodiment, configurations different from those of the first embodiment will be described, and the same configurations will be illustrated using the same reference signs, and description thereof will be omitted.

Figure 33:
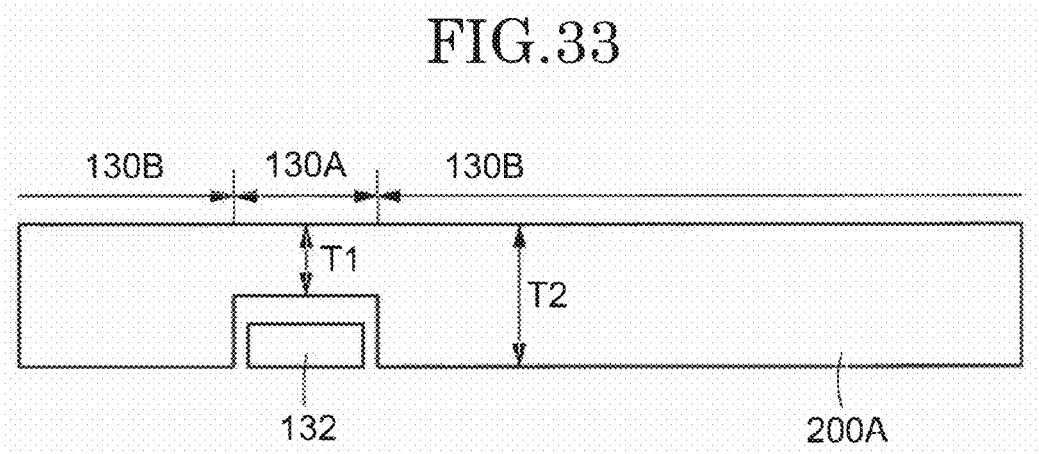
FIG. 33 is a cross-sectional view showing a vicinity of an imaging region in a display device according to an embodiment of the present invention.

FIG. 33 is a cross-sectional view showing a vicinity of the imaging region 130A in the display device 100 according to an embodiment of the present invention. As shown in FIG. 33, in the present embodiment, a thickness of the circuit substrate 200A (strictly, a thickness of the substrate 401 shown in FIG. 6 and FIG. 8) is locally reduced in the imaging region 130A. For example, in FIG. 33, the thickness of the circuit substrate 200A in the non-imaging region 130B is T2, whereas the thickness of the circuit substrate 200A in the imaging region 130A is T1. For example, in order to reduce the thickness of the circuit substrate 200A, a portion (a portion corresponding to the imaging region 130A) of the substrate 401 shown in FIG. 6 and FIG. 8 may be thinned by wet etching, dry etching, laser etching, or the like.

According to the present embodiment, since the optical path length through which external light passes through the display panel (the organic EL panel 200) is shortened in the imaging region 130A, the transmittance of the display panel can be substantially improved. In addition, in the present embodiment, in the case where the imaging element 132 is arranged on the back surface side of the circuit substrate 200A, arranging the imaging element 132 inside a recess formed by the circuit substrate 200A makes it also possible to reduce the thickness of the display device 100.

Each of the embodiments described above as the embodiment of the present invention can be appropriately combined and implemented as long as no contradiction is caused. Furthermore, the addition, deletion, or design change of components, or the addition, deletion, or condition change of process as appropriate by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising:
   a display panel including a display portion having a plurality of pixels and a signal line; and
   a sensor element disposed on a rear side of the display portion, wherein
   the display portion has a first region overlapping the sensor element and a second region other than the first region in a plan view,
   each of the plurality of pixels has a transistor having a semiconductor layer including a channel portion and a conductive portion made of an oxide semiconductor having a polycrystalline structure,
   the signal line extends from the first region to the second region,
   the signal line includes a first part overlapping the first region and a second part overlapping the second region,
   the first part comprises the same layer as the conductive portion,
   the second part comprises a metal layer,
   the conductive region of the transistor in the first region is connected to the first part by being uni-formed, and
   the conductive region of the transistor in the second region is connected to the second part via a contact hole.

2. The display device according to claim 1, wherein the second part includes a plurality of second parts, and the first part is between two of the second parts in a plan view.

3. The display device according to claim 1, wherein the pixel density in the first region is smaller than the pixel density in the second region.

4. The display device according to claim 1, wherein
   the plurality of pixels are arranged on a substrate, and
   a thickness of the substrate in the first region is thinner than that in the second region.

5. The display device according to claim 1, wherein a sheet resistance of the conductive portion is less than 500 Ω/square.

6. The display device according to claim 1, wherein the sensor element is an imaging device.

\* \* \* \* \*